(12) United States Patent
Levine et al.

(10) Patent No.: US 6,933,220 B2
(45) Date of Patent: Aug. 23, 2005

(54) THYRISTOR SWITCH FOR MICROWAVE SIGNALS

(75) Inventors: Jules D. Levine, Santa Clara, CA (US); Ross LaRue, Milpitas, CA (US); Thomas Holden, Saratoga, CA (US); Stanley Freske, San Jose, CA (US)

(73) Assignee: Teraburst Networks, Inc., Sunnyvale, CA (US)

( * ) Notice: Subject to any disclaimer, the term of this patent is extended or adjusted under 35 U.S.C. 154(b) by 0 days.

(21) Appl. No.: 10/788,391

(22) Filed: Mar. 1, 2004

(65) Prior Publication Data

US 2004/0166610 A1 Aug. 26, 2004

Related U.S. Application Data

(62) Division of application No. 09/788,296, filed on Feb. 16, 2001, now Pat. No. 6,700,140.

(51) Int. Cl.[7] .............................................. H01L 21/28
(52) U.S. Cl. ......................... 438/605; 438/606; 438/39
(58) Field of Search ............................... 438/602–606, 438/34–39

(56) References Cited

U.S. PATENT DOCUMENTS

| | | | |
|---|---|---|---|
| 4,952,028 A | * | 8/1990 | Tashiro ....................... 327/514 |
| 5,291,041 A | | 3/1994 | Burke et al. |
| 5,360,990 A | | 11/1994 | Swanson |
| 5,365,477 A | | 11/1994 | Cooper, Jr. et al. |
| 6,552,371 B2 | | 4/2003 | Levine et al. |

* cited by examiner

Primary Examiner—H. Jey Tsai
(74) Attorney, Agent, or Firm—Katten Muchin Rosenman, LLP

(57) ABSTRACT

A thyristor for switching microwave signals includes semiconductor layers disposed on a substrate. A first surface of the thyristor defines an anode, and a second surface of the thyristor defines a cathode. The semiconductor layers include at least one semi-insulating layer. The thyristor transmits a microwave signal between the anode and the cathode in an ON state and blocks the microwave signal between the anode and the cathode in an OFF state.

9 Claims, 20 Drawing Sheets

Grow Wafer

Etch Thyristor to n+ and substrate

Add Metal around Thyristor Base for Row

Deposit and Levellize Polymer

Open Via in Polymer and Deposit Metal for Column

Add Second Polymer layer and Deposit Metal for Upper Ground Plane

Etch backside GaAs to Desired Amount and Deposit Metal for Lower Ground Plane

THYRISTOR SWITCH FOR MICROWAVE SIGNALS

This application is a divisional of U.S. application Ser. No. 09/788,296, filed Feb. 16, 2001, now U.S. Pat. No. 6,700,140 the entire content of which is hereby incorporated herein by reference.

BACKGROUND OF THE INVENTION

1. Field of Invention

The present invention relates to a communications switch and more particularly to a thyristor switch for microwave signals.

2. Description of Related Art (a) Thyristors

The name "thyristor" applies to a general family of semiconductor devices that exhibit bistable characteristics and that can be switched between a high-impedance, low-current OFF state and a low-impedance high-current ON state. Thyristors are well-known in the art. (See, for example, "Physics of Semiconductor Devices", S. M. Sze, Wiley (1981); "Semiconductor Power Devices", S. Ghandhi, Wiley (1977).) Operationally, thyristors are analogous to bipolar transistors, in which both electrons and holes are involved in the transport process. The thyristor is a solid state semiconductor device usually made up of four layers with dopant sequence p-n-p-n, or to be more specific, $p^+$-$n^-$-$p$-$n^+$, where the semiconductor material can be either Si (silicon) or GaAs (gallium arsenide) although most commercially made thyristors are constructed out of Si.

FIG. 1 shows a schematic of a representative two-terminal thyristor that is sometimes called a "Shockley Diode." For silicon devices, the typical doping of the four layers between an anode 2 and a cathode 4 is as follows: $p^+$ ($10^{19}$ cm$^{-3}$), $n^-$ ($10^{14}$ cm$^{-3}$), p ($10^{16}$ cm$^{-3}$) and $n^+$ ($10^{19}$ cm$^{-3}$). This doping profile can be made by diffusion or by using epitaxial layers of the desired doping.

Another two terminal thyristor design used in the industry is a $p^+$-$p$-$n^-$-$p$-$n^+$ structure as shown by the thyristor 5 in FIG. 2 where the doping profile 9 is also illustrated. This thyristor 5 consists of deep p type diffusions made simultaneously into either side of a slice of high resistivity n– type silicon, with an alloyed or diffused $n^+$ type region on one end to form the cathode 8. An aluminum layer is usually alloyed to the other end of the device to form a $p^+$ type anode 6. Typically, thyristors are made from silicon and can be used for large power devices (e.g., 10 cm×10 cm). However, it is also possible to fabricate a thyristor out of GaAs using epitaxial layers as shown in FIG. 3.

In FIG. 3, the $p^+$, $n^-$, p and $n^+$ semiconductor layers of the thyristor 10 are shown in a mesa-like structure with sloped walls disposed on a substrate 10. A metallic ohmic contact 12 to the $p^+$ region serves as the anode. A metal air bridge 14 forms an ohmic contact to the $n^+$ region and to a metallic ohmic contact 16 that serves as the cathode. The metal air bridge 14 can be fabricated by depositing photoresist, opening a via in the photoresist atop the $n^+$ region, depositing metal through a mask, and dissolving the photoresist to leave the air bridge 14 as shown in FIG. 3. Alternatively, an air bridge design may include a dielectric material used for structural support.

A thyristor (e.g., FIGS. 1–3) has hysteresis or memory and is characterized by a high-resistance OFF state and a low-resistance ON state. FIG. 4 shows Va 18 as an operating voltage in the OFF state and Vc 22 as an operating voltage of the ON state. Transitions between the ON state and the OFF state are characterized by a break over voltage Vb 20 and a holding voltage Vh 26 as described in the following sequence.

The OFF state resistance is relatively high, and so the operating voltage Va 18 is essentially the applied voltage across the thyristor; that is, the resistance of the load has little effect. In the OFF state the current (I) is minimal.

When the thyristor is in the OFF state, a Turn-ON pulse voltage greater than the break over voltage Vb 20 causes the thyristor to transition to the ON state at the operating voltage Vc 22.

The operating voltage Vc 22 in the low-resistance ON state is less than the operating voltage Va 18 in the high-resistance OFF state, as characterized by a load line 24 that connects these operating points. The slope of the load line 24 is determined by the resistance of the load.

When the thyristor is in the ON state, A Turn-OFF pulse voltage less than the holding voltage Vh 26 causes the thyristor to transition to the OFF state at the operating voltage Va 18.

Repeat, etc

When the thyristor is in the OFF state, there is no transition when a pulse causes the voltage to decrease (e.g., below the holding voltage Vh); instead, the current continues to decrease along the continuous curve shown in FIG. 4. Similarly, when the thyristor is in the ON state, there is no transition when a pulse causes the voltage to increase; instead the current continues to increase along the continuous curve shown in FIG. 4.

Pulse circuits are typically used for operating the thyristor. Examples of a Turn-ON pulse 30 and a Turn-OFF pulse 32 are presented in FIG. 5 with reference to the thyristor I-V curve shown in FIG. 4. In the initial OFF state, the operating voltage is Va before the ON pulse 30 is applied. Because the amplitude Vg of the ON pulse 30 is greater than the break over voltage Vb, the thyristor switches from OFF to ON and the operating voltage drops to Vc. Similarly, in the initial ON state, the operating voltage is Vc before the OFF pulse 32 is applied. Because the amplitude (zero volts) of the OFF pulse 32 is less than the holding voltage Vh, the ON state collapses and the OFF state is obtained with the operating voltage Va.

The lightly doped $n^-$ region shown in FIGS. 1–3 is critical to the operation of the thyristor. The thickness (sometimes called width) and the doping level of this $n^-$ region both affect the voltage required to obtain reach through of the $n^-$ region and therefore the magnitude of the break over voltage Vb.

Typically the application of thyristors has been mostly limited to applications such as power systems with relatively low frequencies (e.g., 60 Hz power control). Thyristors generally have not been used in applications involving higher frequencies including the range of microwaves (e.g., roughly 300 MHz–300 GHz).

(b) Telecommunications Switch Arrays

FIG. 6 illustrates a permutation switch element for use in the telecommunications industry. At each node there is the possibility of a connection between the input rows and the ouput columns. For example, Input r2 is connected to output s3 as shown in the diagram. There are N! different configurations possible in a permutation switch of dimension N (e.g., N=6 in FIG. 6). The important case where there are N inputs and N outputs is called an N×N switch or an N×N switch array, where an array may be made from a combination of switch elements.

A typical wavelength switch element used in the telecommunications industry is called an optical crossconnect switch (OXC). The OXC uses mirrors that can move a light spot from one location to another. The OXC is a permutation switch; that is, any one input is connected to only one output and vice versa. The net result is that the light intensity is retained during its passage through the switch and not diluted by a multiplicity of connecting paths.

A major disadvantage of the OXC is that it is not possible to vary the wavelength between input and output. That is, the wavelength of input r2 and output s3 must be the same. Many optical networks require the additional flexibility of assigning to the output s3 a wavelength different from that of the input r2. This can be done in the network by adding much more complex and costly extra equipment that effectively adds considerable cost to the OXC.

In FIG. 6, the array size is drawn for N=6. However, the array size for a crossconnect application should be appreciably larger, perhaps large enough to accommodate ~50 fibers in each cable and ~20 wavelengths in each fiber. A typical crossconnect switch can therefore have N~1,000 to best optimize the performance of the communication network.

It is possible to use tiling to assemble a multiplicity of smaller m×m crossconnect arrays into a larger N×N array as shown in FIG. 7. The system of 9 arrays or chips is shown within the bold line. All interconnections can be made on a printed circuit board and carry the full bitrate. For example 100 68×68 chips can be arranged to form a larger array of 10*68×10*68=680×680. Tiling obviously requires appreciable cost, especially at the higher bitrates and larger array sizes.

Alternative approaches to optical switching devices may include conversion of an optical signal to an electrical signal that can be manipulated using digital switching devices and then converted back to an optical signal. For example, a digital optical signal with bitrate B can be passed through a photodetector, in which case it is converted to an electronic signal with the same bitrate. The bit rate B of information flow in each optical stream at each wavelength can be any one of the standard values. For example, B=2.5, 10, and 40 Gbps, for the industry standards OC-8, OC-192 and OC-768, respectively. The general trend in optical communications is for the higher bit rates.

For switching electrical signals, digital switches are often used to create crossconnect arrays with a structure similar to the switch shown in FIG. 6. A digital switch can be located at each node of FIG. 6. Digital switch arrays are composed of active digital switches that operate at the bitrate B. Each switch senses the digital electrical signal at the switch input and recreates the digital electrical signal at the switch output. The switches require power and this power increases with the bitrate. The switch operation is done electrically at microwave or millimeter wave frequencies. For example, at a bitrate of B=10 Gbps, the switch time to go from a "1" to a "0" is less than 1/B or less than 0.1 nanosecond. This is in contrast with the array switching time which is about 1 microsecond.

Digital switches convert each incoming digital stream of 0's and 1's into another digital stream with the same amplitude and waveform shape. The digital switches are totally active and respond to the actual bit rate. For example, a switch which is designed for bitrate B=10 Gbps must actively respond to this data rate. The time for this active switching operation is of the order of 1/B, which for this example is 0.1 nanosecond. Also, these chips can be used in more generalized configurations than the simple permutation configuration shown in FIG. 6. With digital switches, one input can be sent to two or more outputs although this functionality is generally not critical for applications involving system reconfiguration and wavelength modification for optimal system utilization and protection.

In general, the array switching time required to reconfigure a switch array in order to change the linkages and wavelengths need not be less than 1 ms., which is an acceptably small fraction of the ~50 ms time required for setup and confirming communication between linkages ~100 km apart. Therefore, the ability of digital switches to change configurations in substantially less than one millisecond is generally not relevant in most telecommunications applications.

Digital switch arrays are characterized by their array size N and their bitrate B. Typically, a given array configuration of N inputs and N outputs can be switched to another configuration having the inputs and outputs arranged in a different order within a time period of about one microsecond. Some nominal values of B and N corresponding to known discrete components are given in FIG. 8, where the optimal values of the data points take the general shape of a hyperbola.

These chips can be made of GaAs as on the left side of FIG. 8 or Si as on the right side of FIG. 8. Other materials are also possible. Typically large arrays have low bitrates and vice versa because of issues related to power consumption and bit rate for these active devices. The chips represented in FIG. 8 lie on or to the left of the characteristic hyperbola. However, the region to the right of the hyperbola with a relatively high bit rate and large array size is a more desirable operating region for many telecommunications applications and so the applicability of these devices is limited.

SUMMARY OF THE INVENTION

Accordingly, it is an object of this invention to provide a thyristor for switching microwave signals.

It is a further object to provide a thyristor that reliably transmits microwave signals.

It is a further object to provide a microwave switch that enables microwave tansmission and switch control along a single line.

In a preferred embodiment of the present invention, a thyristor for switching microwave signals includes semiconductor layers disposed on a substrate. A first surface of the thyristor defines an anode, and a second surface of the thyristor defines a cathode. The semiconductor layers include at least one semi-insulating layer. The thyristor transmits a microwave signal between the anode and the cathode in an ON state and blocks the microwave signal between the anode and the cathode in an OFF state.

Preferably there are two semi-insulating layers. In a preferred six-layer configuration, the thyristor may be configured as either $p^+$-i-n-i-p-$n^+$ or $n^+$-i-p-i-n-$p^+$, where "i" denotes a semi-insulating layer.

The layers may be made from either GaAs (gallium arsenide) or Si (silicon). In the case where the layers are made from GaAs, the semi-insulating layers may include semi-insulating GaAs, and in the case where the layers are made from Si the semi-insulating layers may include intrinsic Si. The thyristor may be configured as a mesa with an air bridge as part of the metallic connections at the anode and cathode.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings, where.

DETAILED DESCRIPTION OF THE PRESENTLY PREFERRED EXEMPLARY EMBODIMENTS

Figure 9:
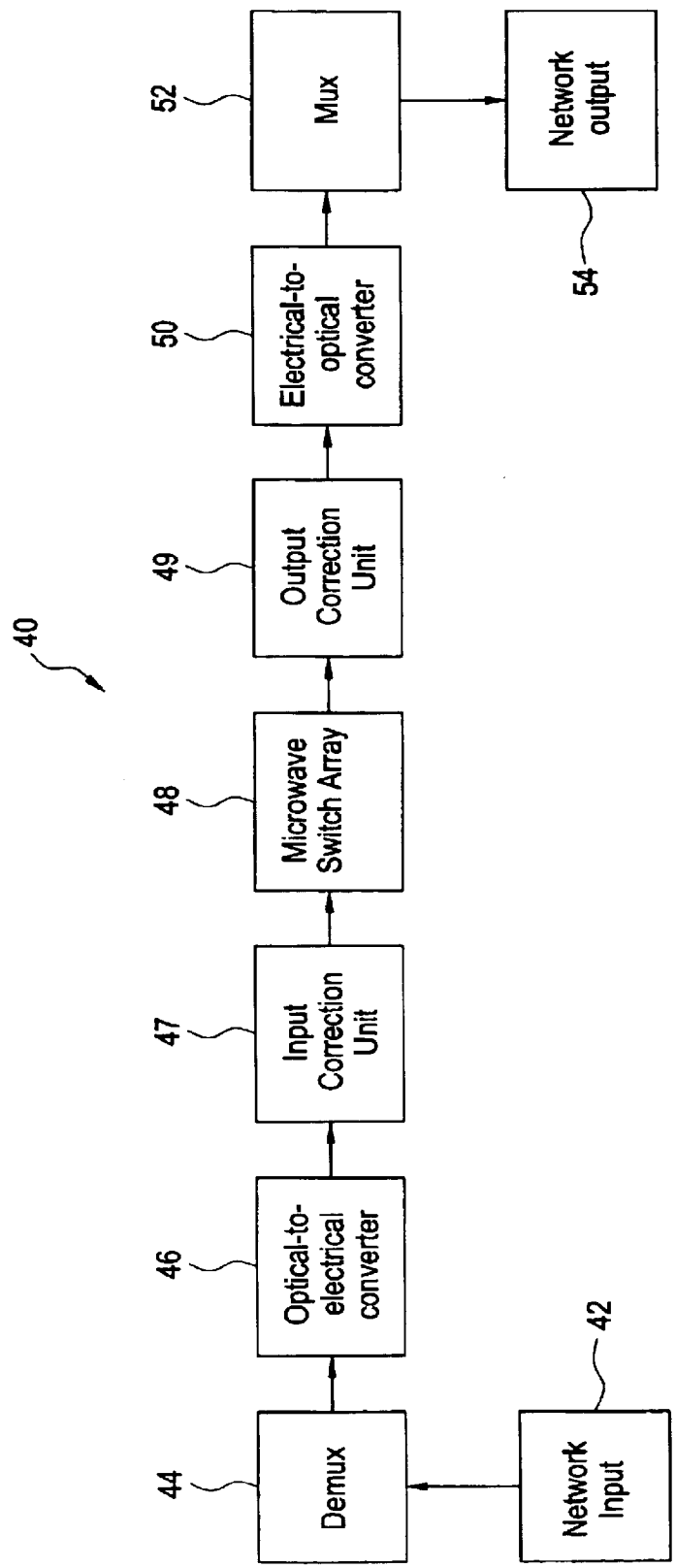
FIG. 9 is a schematic diagram of a telecommunications switch array used to reconfigure a network according to the present invention.

A preferred embodiment of a telecommunications switch array 40 according to the present invention is illustrated in FIG. 9. A network input optical signal 42 from multiple optical fibers is passed through a demux device 44 that separates out the combined dense wave division multiplexing (DWDM) wavelengths into distinct multiple optical signals. An optical-to-electrical converter 46, which typically includes at least one photodetector, converts each resulting optical signal into an electrical signal where the frequency of the electrical signal is in the microwave range (e.g., from 20 MHz to 50 GHz). An input correction unit 47 receives and corrects each electrical signal.

Figure 6:
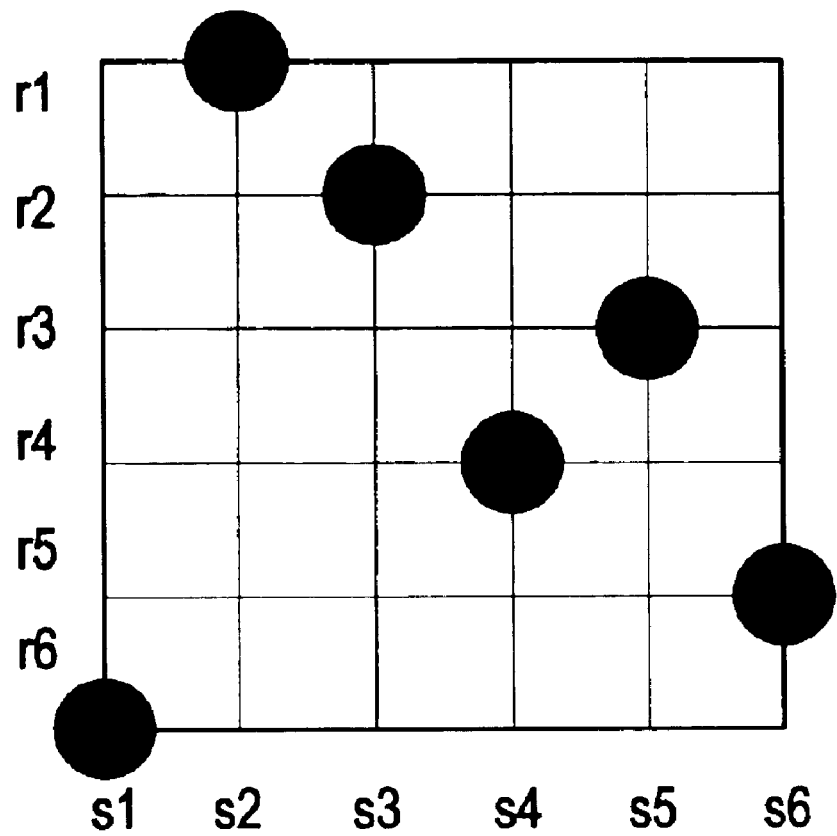
FIG. 6 is a schematic diagram of an N×N telecommunications switch array.
Figure 7:
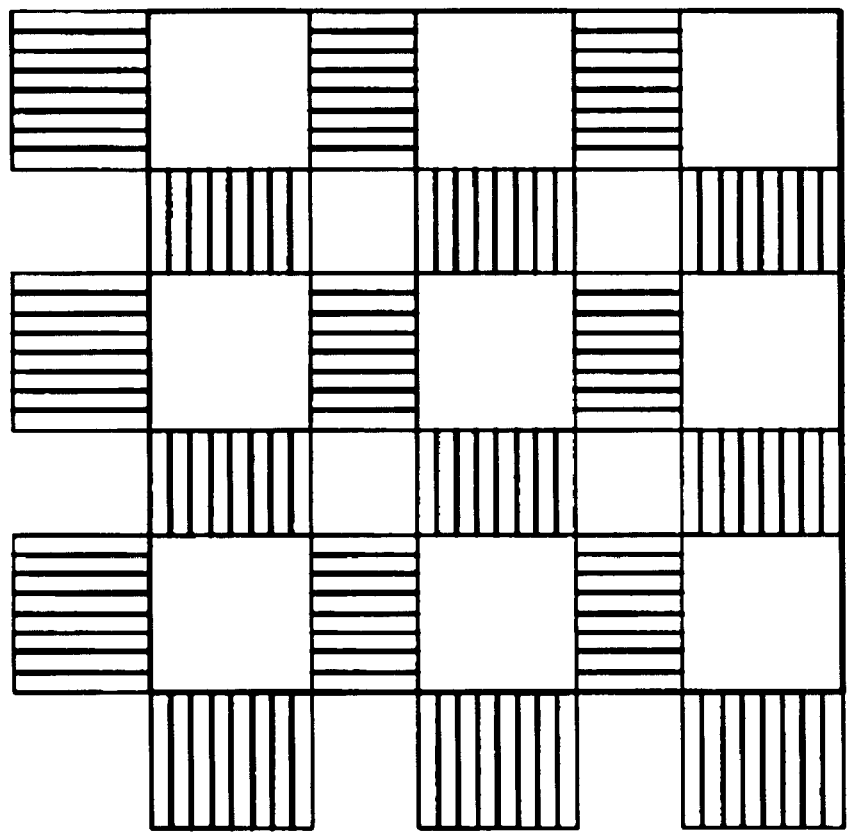
FIG. 7 is a tiling of 9 m×m arrays to create a single larger 3 m×3 m array.

An N×N microwave switch array 48 receives the electrical signals from the input correction unit 47 and routes the signals based on external commands that may alter the configuration of the array 48 and the wavelengths of the transmitted signals. Preferably, the switch array 48 is an analog device that transmits all frequencies from DC (direct current) to a relatively large maximum frequency $f_B$ related to the bitrate B, without distortion (e.g., $f_B$~40 GHz). That is, the switch array 48 is a broadband switch array. In the preferred embodiment the telecommunications switch array 40 is configured as a permutation switch array (cf. FIG. 6) although modifications of this configuration (e.g., inactive channels) are possible.

The electrical output from the switch array 48 is passed through an output correction unit 49 that corrects the output and passes the result to an electrical-to-optical converter 50. The electrical-to-optical converter 50, which typically includes at least one laser and modulator, transforms electrical signals into optical signals. A mux device 52 combines the wavelengths and transmits the resulting optical signals in DWDM format along corresponding fibers to the network output 54.

Figure 8:
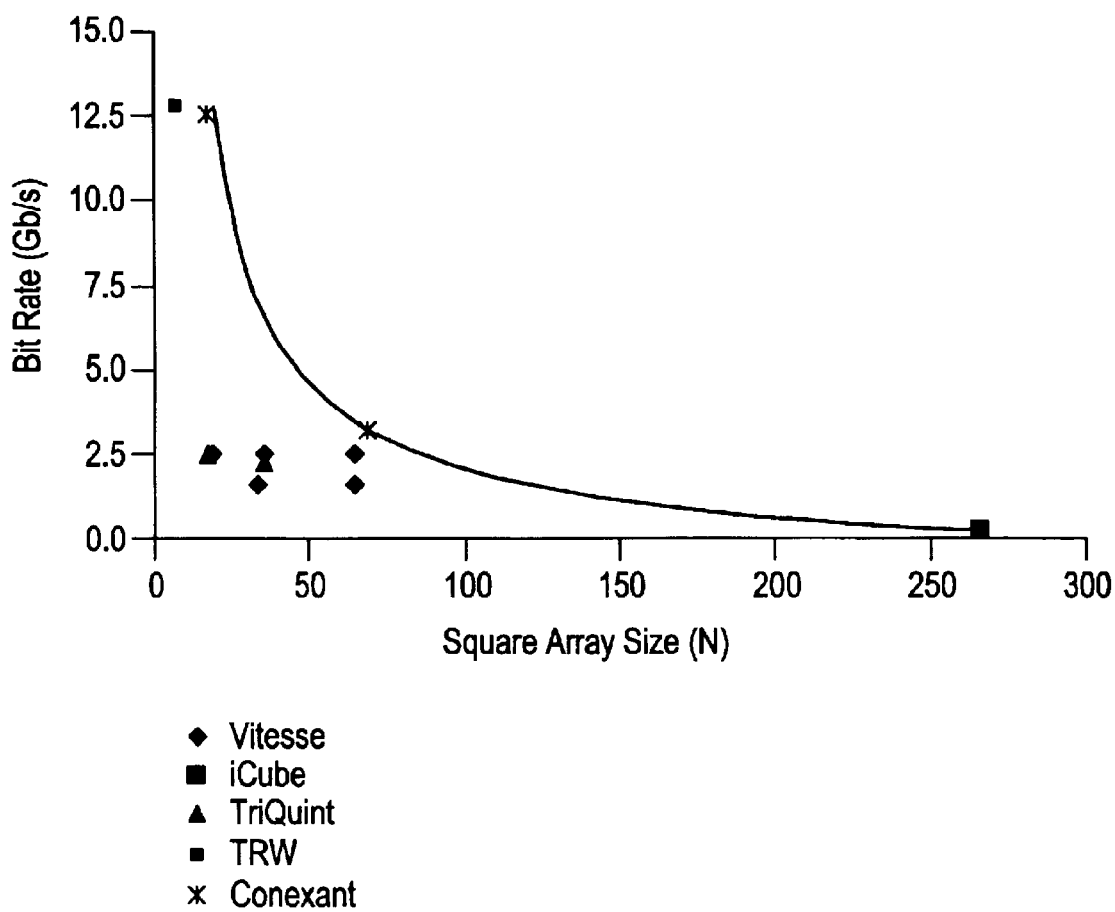
FIG. 8 is a plot of digital microwave crosspoint switch arrays relating representative array sizes and bit rates.

In the preferred embodiment, a microwave switch array 48 is used as the building block for the telecommunications switch array 40 instead of an active digital switch as described above e.g., FIG. 8). Additional switch functionality (e.g., add/drop capability) may be added to the embodiment. Traffic in the opposite direction is characterized by reversing the polarity of the arrows in FIG. 9.

Figure 10:
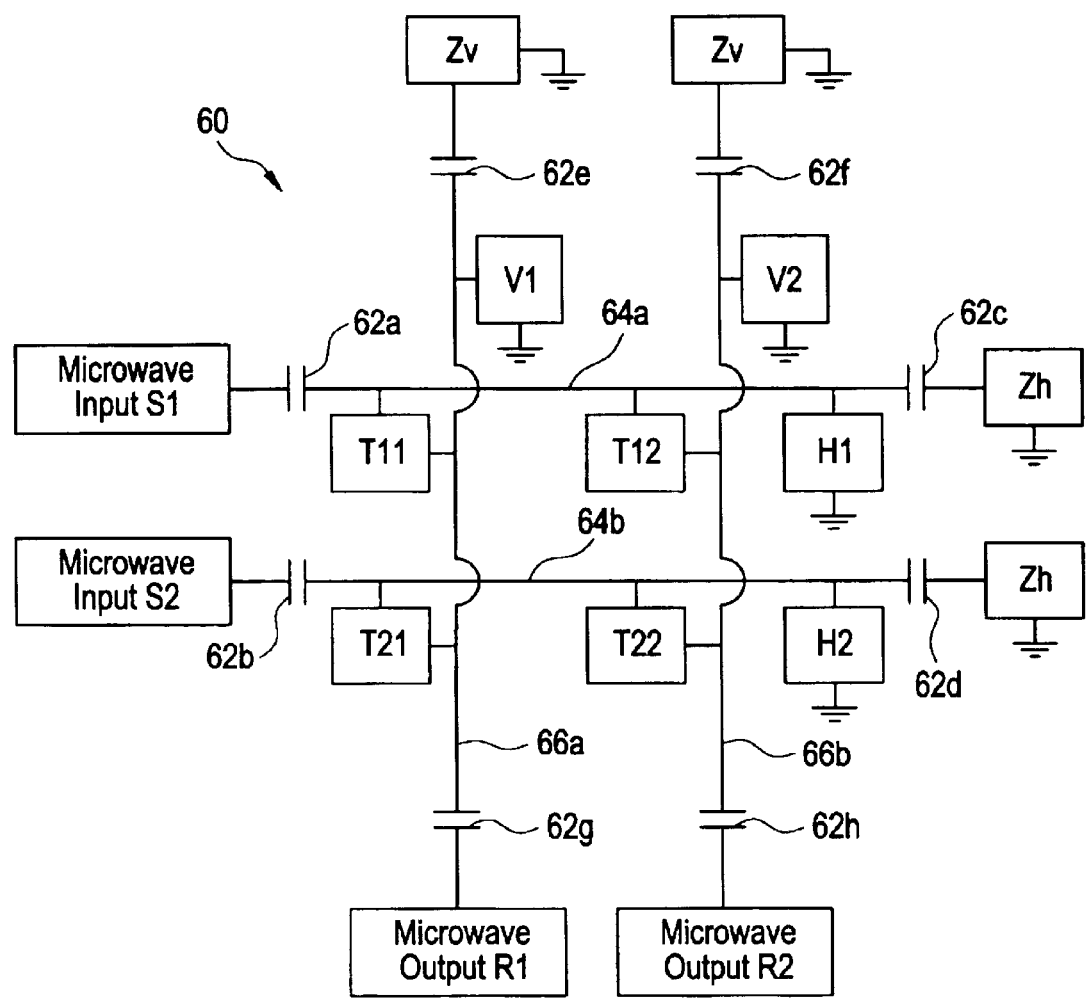
FIG. 10 shows a 2×2 switch array according to an embodiment of the present invention.

A preferred embodiment of a microwave switch array 48 is shown in FIG. 10 as a 2×2 switch array 60. Microwave input signals S1 and S2 enter from the left along input lines 64a–64b, and microwave output signals R1 and R2 exit from the bottom along output lines 66a–66b. The input lines 64a–64b and output lines 66a–66b terminate at resistors Zh and Zv to ground to avoid microwave reflections within the array 60. Nominally these resistors Zh, Zv can be identical with a resistance value of 50 ohms.

The array 60 includes thyristor elements T11, T12, T21 and T22 that connect the input lines 64a–64b and the output lines 66a–66b. The thyristors are controlled by horizontal and vertical pulse circuits H1, H2, V1, V2 that operate to switch thyristors individually between an ON state and an OFF state. Additionally, capacitors 62a–62h are included to prevent DC signals from the pulse circuits H1, H2, V1, V2 from leaking to the microwave input and output channels and causing reflections within the array 60 at lower frequencies and to prevent the DC signals from being loaded down by the resistors Zh, Zv and the microwave sources and sinks. Nominally, these capacitors 62a–62h can be identical with a capacitance of 0.1 μf.

Every input line 64a–64b and every output line 66a–66b must cross over each other once. The crossovers are shown in the diagram by semicircular vertical arcs, located where each vertical line passes over each horizontal line. These crossovers can be fabricated using conventional technology such as the air bridge design shown in FIG. 3. In general, there will be N input rows, N output columns and $N^2$ thyristor switch elements.

Figure 11:
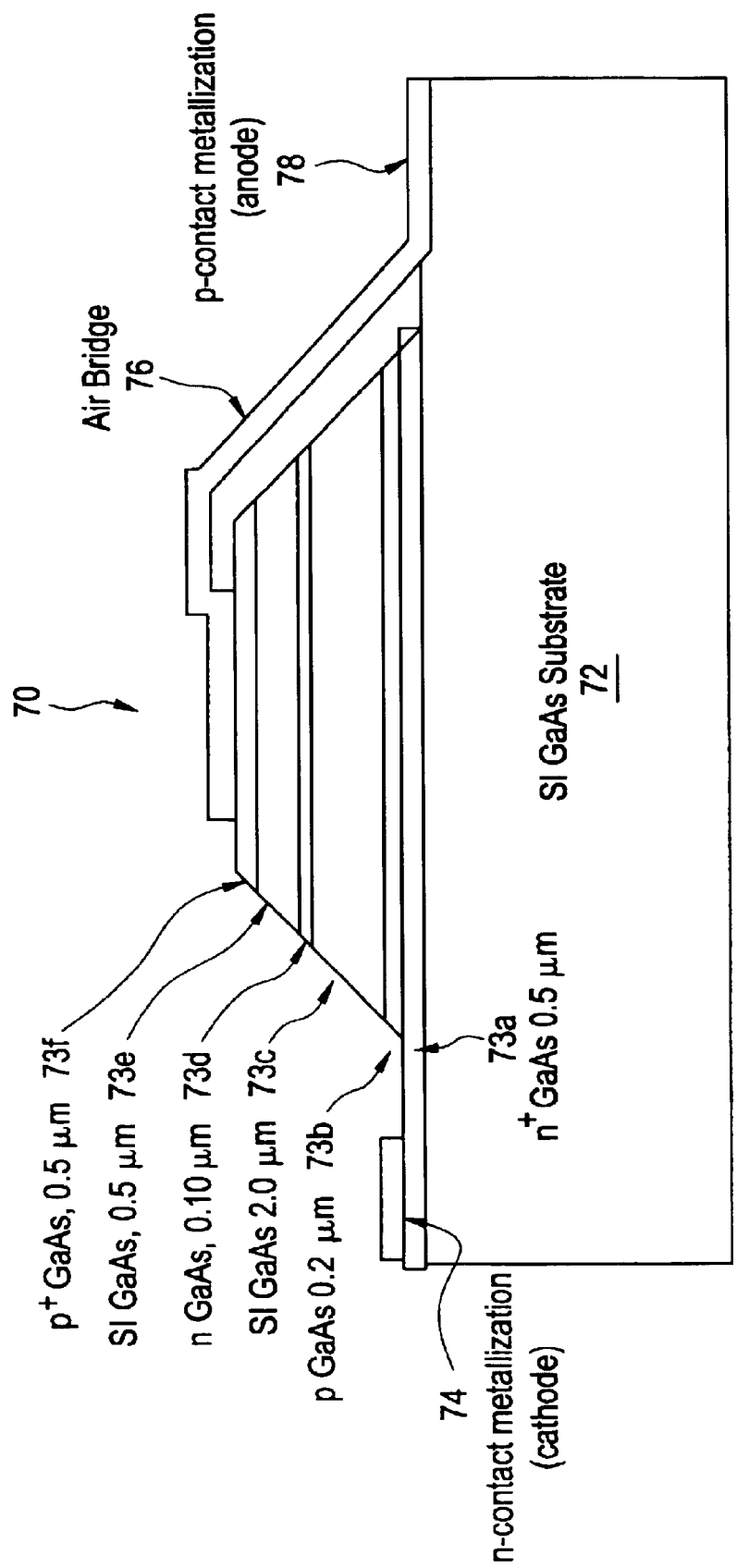
FIG. 11 shows an embodiment of a thyristor design according to an embodiment of the present invention.

A preferred embodiment for an individual thyristor according to the present invention is shown in FIG. 11. The thyristor 70, disposed on a semi-insulating (SI) GaAs substrate 72 includes an n-contact metallization 74 at the cathode and an air bridge 76 that connects to a p-contact metallization 78 at the anode. This design includes six layers, which is greater than in the conventional 4 layer p⁺-n⁻-p-n⁺ thyristor discussed above (e.g., FIG. 1). The bottom layer 73a, disposed on the substrate 72, is n⁺ GaAs with a thickness of 0.5 μm. The next layer 73b is p GaAs with a thickness of 0.2 μm. The next layer 73c, the first semi-insulating layer, is SI GaAs with a thickness of 2.0 μm. The next layer 73d is n GaAs with a thickness of 0.10 μm. The next layer 73e, the second semi-insulating layer, is SI GaAs with a thickness of 0.5 μm. The next layer 73f, the top layer, is p⁺ GaAs with a thickness of 0.5 μm. In the thyristor 70, the upper five layers 73b–73f are formed in a mesa configuration with a base diameter of 20 μm and an angle of about 45 degrees. These layers are fabricated on a homogeneous wafer and then etched to reveal the mesa-like structure shown in the figure. The structure of this thyristor 70 is denoted as p⁺-i-n-i-p-n⁺, where "i" indicates a semi-insulating layer.

Figure 3:
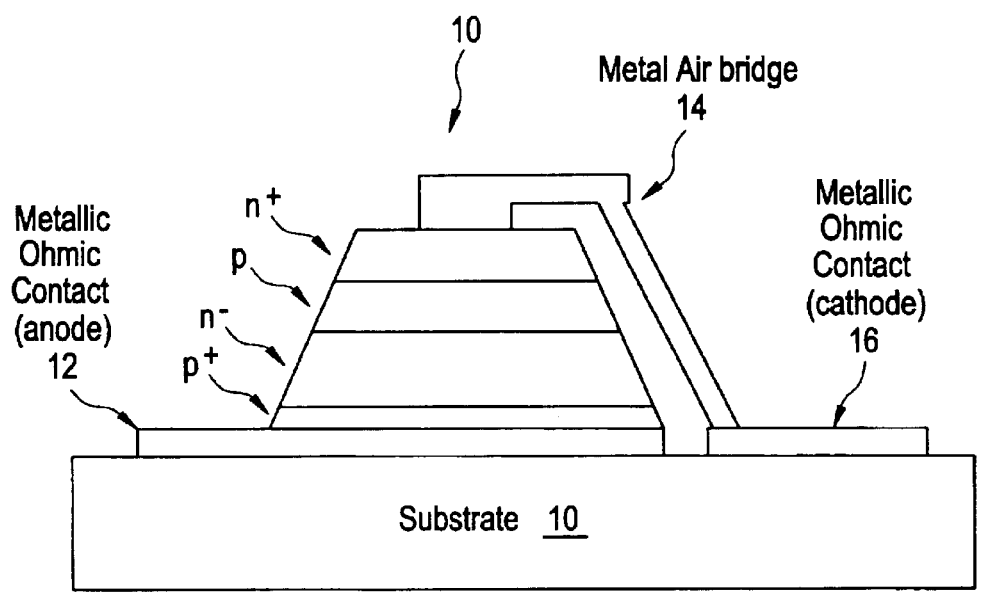
FIG. 3 is a diagram of a thyristor.

The air bridge 76 can be made by conventional methods (cf. FIG. 3). A via made in an evaporated dielectric material coating the mesa allows for a metallization stripe to be evaporated in the n+ region and over the slanted portion of the mesa to the flat SI GaAs region. Finally the dielectric is removed leaving an air bridge 76 as shown.

In the thyristor 70, the lowest layer 73a is n+ GaAs with a relatively high doping of $10^{19}$ cm⁻³. The lowest layer 73a enables a lower ON state series resistance by lowering the anode contact resistance. The next layer 73b is p GaAs with a doping of $10^{18}$ cm⁻³, a lower value set for a base transport coefficient close to unity. The first semi-insulating layer 73c and the second semi-insulating layer 73e are made of semi-insulating (SI) GaAs which is a highly resistive material with residual n doping set at $5*10^{14}$ cm⁻³. The layer 73d between the two semi-insulating layers 73c, 73e is n GaAs with a doping of $1*10^{17}$ cm⁻³. The top layer 73f is p⁺ GaAs with a doping of $10^{19}$ cm⁻³ for low series contact resistance.

An alternative embodiment results from using Al GaAs (aluminum gallium arsenide) instead of GaAs in the first and sixth layers 73a, 73f. Then hetero-barriers are formed between the first and second layers 73a, 73b and between the fifth and sixth layers 73e, 73f. These Al GaAs layers reduce hole recombination in the n+ layer 73a and electron recombination in the p+ layer 73f, thereby increasing the conductivity of the SI GaAs layers 73c, 73e. As a result, the ON state series resistance is further reduced.

Figure 1:
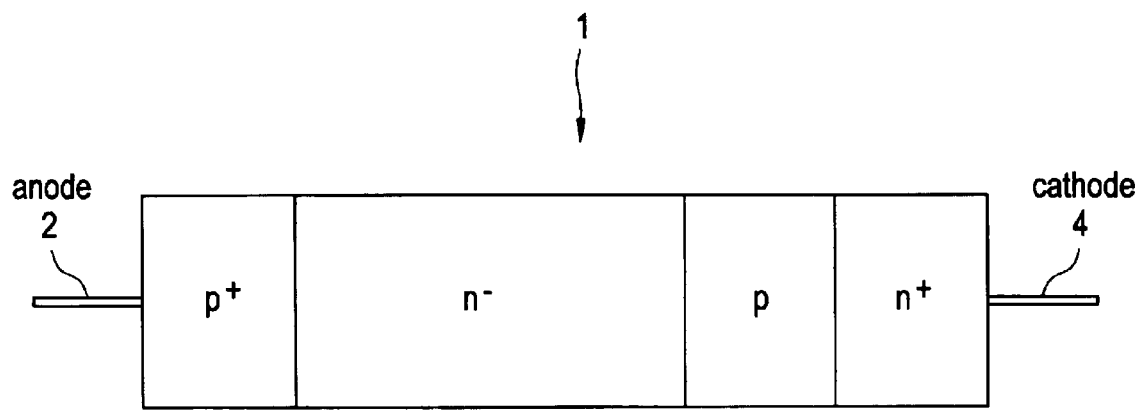
FIG. 1 is a diagram of a thyristor.
Figure 2:
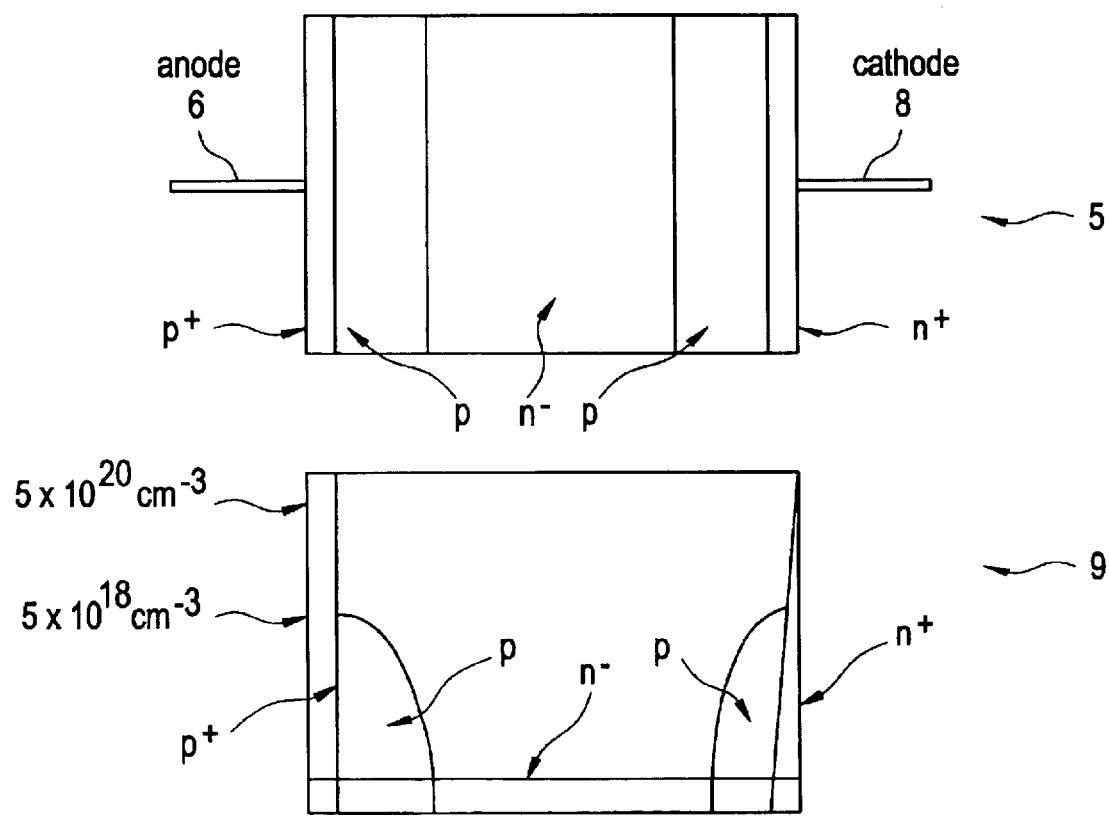
FIG. 2 is a diagram of a thyristor.

As discussed below in further detail, the two semi-insulating layers 73a, 73b of the thyristor 70 desirably decrease the capacitance compared with structures without such layers (e.g., FIGS. 1–3). Typically a thyristor is used for power control at low frequencies, frequently 60 Hz, so the capacitance is not a critical parameter. But in the present application to switching microwave signals, low capacitance is critical to achieving high frequency blocking when the thyristor 70 is in the OFF state (cf. FIG. 4). The central portion of the thyristor 70 is somewhat similar to the central portion of a PIN diode where an insulating layer separates a p-layer from an n-layer. Since the device involves recombination of electrons and holes within each insulating layer, there is no space charge at high level injection.

Figure 4:
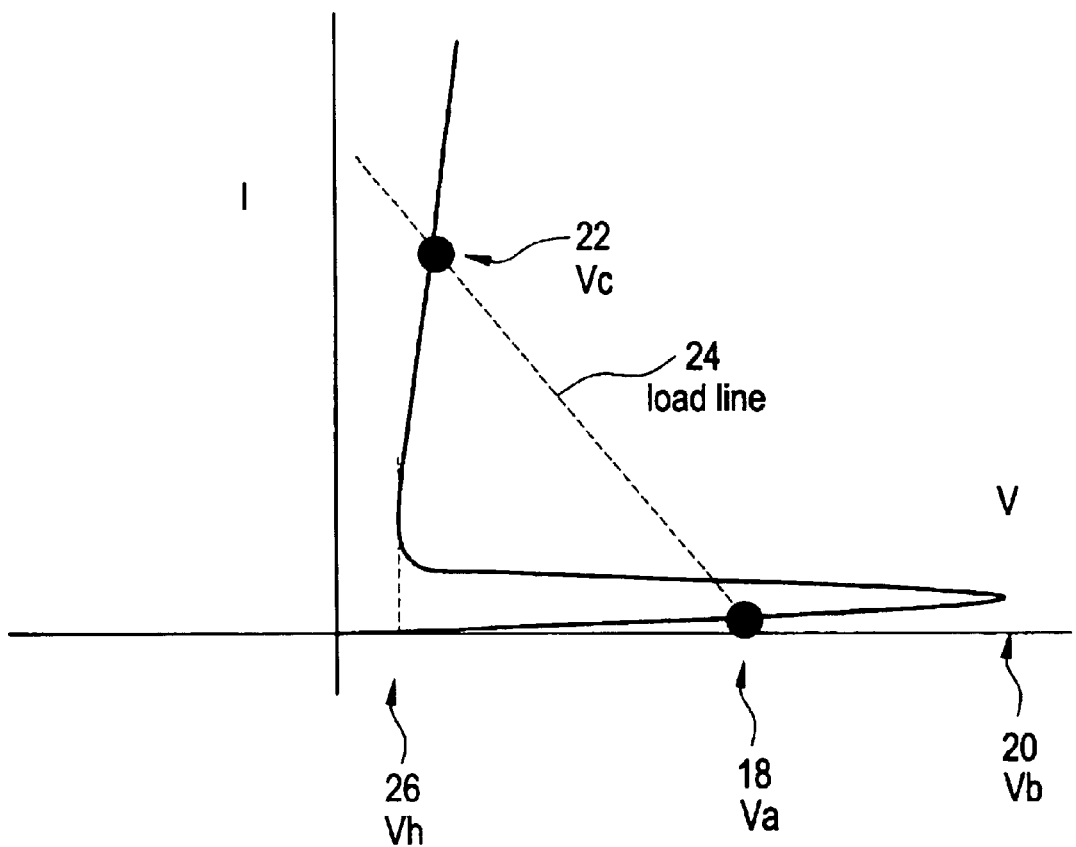
FIG. 4 is an I/V curve related to the operation of a thyristor.

For example, a typical calculation with the above design parameters for the thyristor 70 gives Vh=1 volt for the holding voltage and Vb=25 volts for the break over voltage, and acceptable values for the operating voltages in the ON state Vc and OFF state Va are 1.5 volts and 15 volts respectively (cf. FIG. 4).

Switching in telecommunication applications can require broadband high frequency performance from D.C. to 40 GHz or more. Good performance means high switch isolation in the OFF state over the frequency of interest as well as low insertion loss in the ON state. For almost all analog microwave switching elements of interest to be used in telecommunication applications, the OFF state isolation is determined by the parasitic off capacitance $C_{off}$, (the OFF state capacitance) as $$\text{Isolation} = 10\text{Log}\left[1 + \frac{1}{4\omega^2 Z_o^2 C_{off}^2}\right] dB \quad (1)$$

where $Z_o$ is the load impedance and ω is the angular frequency (i.e., ω=2πf). In the ON state, the insertion loss is determined by the parasitic series resistance $R_{on}$, (the ON state resistance) and is given by, $$\text{Insertion Loss} = 10\text{Log}\left[1 + \frac{R_{on}}{Z_o} + \frac{R_{on}^2}{Z_o^2}\right] dB \quad (2)$$

These equations show the importance of low parasitic capacitance in the OFF state and low parasitic series resistance in the ON state for a microwave switch. For the design parameters presented above, nominal values are $Z_o$=50 ohms for the load impedance, $R_{on}$=6 ohms for the ON-state resistance, and $C_{off}$=14.7 fF for the OFF-state capacitance. At f=10 GHz for the operating frequency, this leads to acceptable levels for the isolation and insertion loss of −20 dB and 0.5 dB, respectively.

The ON state resistance $R_{on}$ of the thyristor 70 is comparable to that of a p-i-n diode, a device that is commonly used for low insertion loss switching. For example, the contribution to the ON state resistance $R_{on}$ from the semi-insulating layers can be estimated as $$R_i = \frac{(w_{i1} + w_{i2})^2}{(\mu_1 + \mu_2) I_f \tau} \quad (3)$$

where $W_{i1}$ is the thickness of the first semi-insulating layer 73c, which is part of the n-i-p junction, $W_{i2}$ is the thickness of the second semi-insulating layer 73e, which is part of the p⁺-i-n junction, and $\mu_1$ and $\mu_2$ are the corresponding electron and hole mobilities associated with these layers. Here $I_f$ is the forward conduction current in the on state and τ is the minority carrier lifetime. This expression is similar to that of a p-i-n diode switch, which has instead only one intrinsic layer thickness. The contribution $R_i$ must be added to the ohmic contact and other parasitic series resistances to obtain $R_{on}$.

The OFF state capacitance, $C_{off}$ is desirably decreased by the inclusion of the semi-insulating layers 73c, 73e in the thyristor 70. First, the break over voltage is determined by the applied bias to the anode required to reach through the n-layer 73d. Therefore the capacitance of the device in the OFF state, as determined by the thickness of the semi-insulating layers 73c, 73e is decoupled from the doping and thickness of the n-layer 73d and therefore decoupled from the break over voltage Vb. This ultimately results in lower capacitance in the off state compared to the conventional p⁺-n⁻-p-n⁺ thyristor 1. This can be verified by the use of the depletion approximation in order to compute the junction capacitance of the thyristor when zero or positive bias below the break-over voltage is applied to the anode. Due to current continuity considerations, when zero or positive bias below the break-over voltage is applied to the anode, the n-i-p junction of the thyristor 70 or the n⁻-p junction of the conventional thyristor 1 is reverse biased by an amount equal to the applied anode bias. The resulting depletion width, $W_d$, and capacitance, $C_{off}$ of the device are given by, $$W_d = \sqrt{\frac{2\varepsilon}{qN_d}(\varphi_b + V_{app})} \text{ cm} \quad (4)$$

$$C_{off} = \frac{\varepsilon A}{W_d} \text{ pF} \quad (5)$$

where $W_d$ is the depletion layer thickness, $\varepsilon$ is the permitivity of the semiconductor, $N_d$ is the doping of the n⁻ or unintentionally doped layer, $\Psi_b$ is the built in voltage of the reversed bias junction, $V_a$ is the applied anode bias and A is the thyristor area. As an example, for the p⁺-i-n-i-p-n⁺ thyristor 70 constructed from GaAs, the unintentionally doped layer can be as low as 5×10¹⁴/cm³. Simultaneously the doping and thickness of the n-layer can be adjusted for a wide range of break over voltages. If the applied bias, $V_{app}$, is zero, equation (4) yields a value of 2×10⁻⁴ cm for the depletion width, $W_d$. For a thyristor of 2×10⁻³ cm diameter this yields a zero bias capacitance of approximately $C_{off}$=0.018 pF.

By comparison, one can estimate the capacitance of a conventional thyristor 1 with a p⁺-n⁻-p-n⁺ structure from the relationship $$V_b = \frac{qN_d}{2\varepsilon}W_n^2 - \sqrt{\left(\frac{2qN_d}{\varepsilon}\varphi_b\right)}W_n \text{ Volts} \quad (6)$$

where $N_d$ and $W_n$ are the doping and width of the n⁻ layer. Since it is preferable from circuit drive considerations that a switching thyristor used for telecommunications applications be a low power device, a break over voltage Vb=25 volts is assumed. Then, for example, if a value of 2.5×10⁻⁴ cm is assumed for $W_n$, equation (6) yields a value of 9.1×10¹⁵/cm³ for the doping $N_d$. As a result, for zero applied anode bias, the depletion width determined by equation (4) is 4.68×10⁻⁵ cm and the thyristor off capacitance, $C_{off}$, is 0.077 pF, a value that is more than four times higher than the estimated capacitance of the thyristor 70. Furthermore, even this set of design parameters presents disadvantages for the conventional thyristor 1 since it is difficult to obtain repeatable low doping concentrations of 9.1×10¹⁵/cm³ in GaAS by using GaAs organo-metallic vapor phase epitaxy (OMVPE).

Thus, the inclusion of the semi-insulating layers in the thyristor 70 desirably decreases the OFF state capacitance as compared with a conventional thyristor 1. From equation (5) one can also estimate the OFF state capacitance in terms of the dominant effect due to the semi-insulating layers:

$$C_{off} = \frac{\varepsilon A}{W_{i1} + W_{i2}} \text{ pF} \quad (7)$$

where $W_{i1}$ and $W_{i2}$ are the thicknesses of the fist semi-insulating layer 73c and the second semi-insulating layer 73e, which are respectively associated with the n-i-p and p⁺-i-n and junctions. It is assumed that the doping of these layers 73c, 73e is sufficiently low so that these layers are fully depleted for all applied cathode voltages, $V_{app}$, below the break over voltage Vb.

Figure 12:
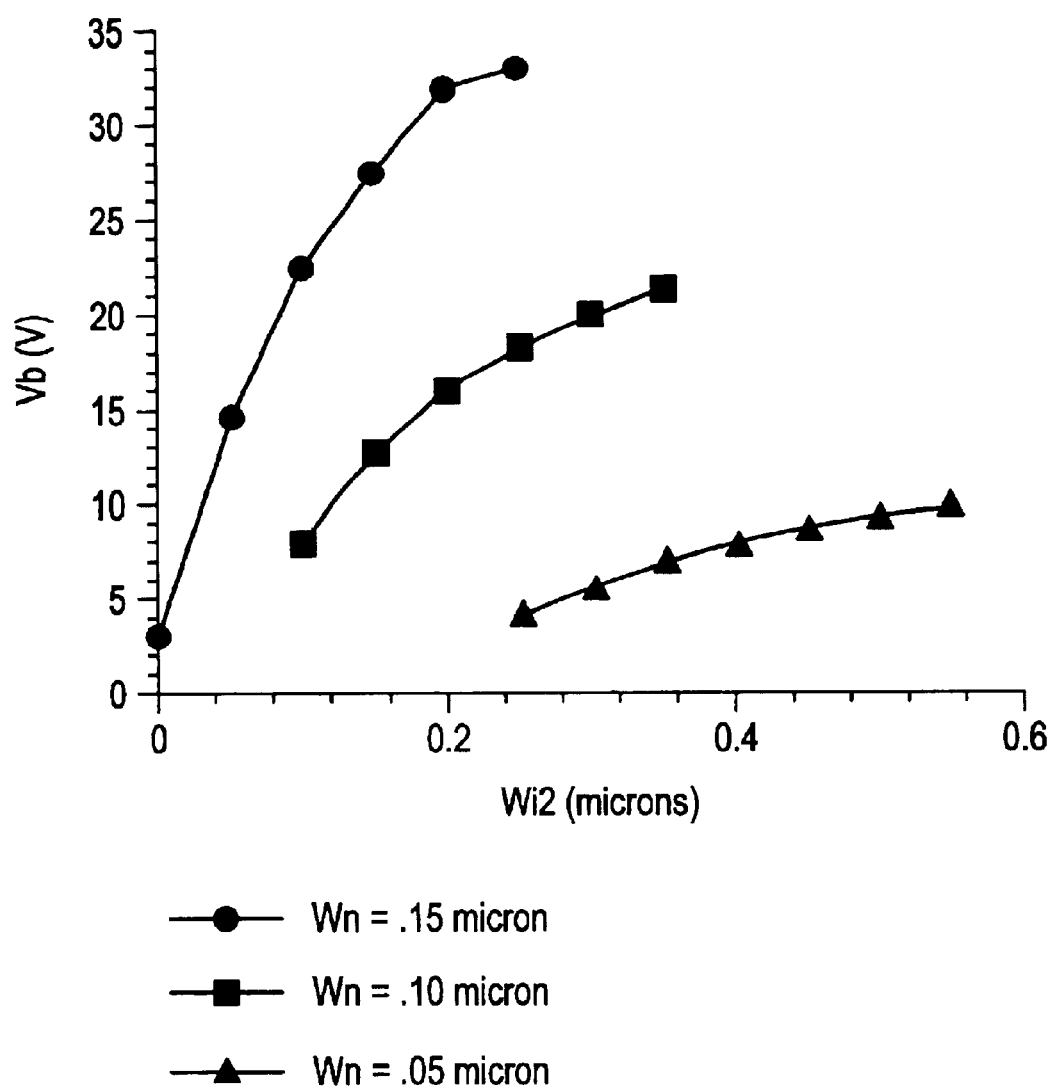
FIG. 12 shows break over voltage Vb versus thickness of intrinsic layer $W_{i2}$ according to an embodiment of the present invention.

The inclusion of the semi-insulating layers in the thyristor 70 also desirably affects the stability of the break over voltage Vb. This advantage is depicted in FIG. 12 in which the break over voltage, Vb, shown on the vertical axis of the plot, is computed as a function of the thickness, $W_{i2}$, of the second semi-insulating layer 73e, which is part of the p⁺-i-n junction. Shown in FIG. 12 are three curves corresponding to three different thickness values, $W_n$, of the n-layer 73d. The n-layer doping concentration is assumed to be 1×10¹⁷/cm³. It is clear from this plot that larger values of $W_{i2}$ result in reduced sensitivity of the break over voltage Vb with respect to variations in $W_{i2}$. This is preferable from the standpoint of device repeatability and manufacturability since it is commonly known that variations in the thickness of epitaxially grown layers occur in practice.

Other embodiments for thyristors according to the present invention are also possible. For example, the layer design in FIG. 11 given by p⁺-i-n-i-p-n⁺ may be inverted to give n⁺-i-p-i-n-p⁺. Also in the first and sixth layers 73a, 73f the material AlGaAs may be substituted for GaAs to better reduce the ON state series resistance as discussed above. The use of GaAs in the thyristor design advantageously minimizes the space required for the thyristor 70; however, other semiconductor materials may also be used with appropriate modifications. For example, when the thyristor is made from Si (silicon), the semi-insulating layers 73c, 73e can be made from intrinsically doped silicon. Additionally, the number of layers and their corresponding doping levels may vary. By including one or more semi-insulating layers in the design of a thyrsistor, the present invention desirably decreases its capacitance, thereby enabling passthrough of microwave signals in the ON state as well as blocking of microwave signals in the OFF state.

Figure 13:
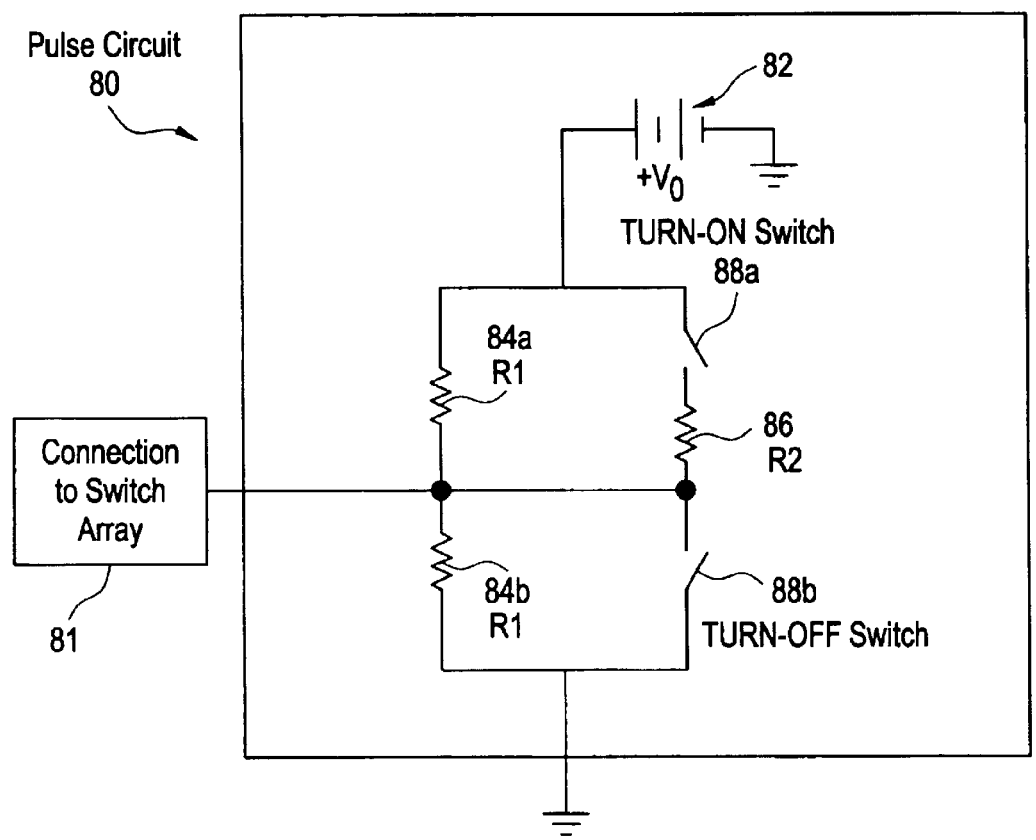
FIG. 13 shows an embodiment of a pulse circuit according to an embodiment of the present invention.

In practice, the horizontal pulse circuits H1 and H2 and the vertical pulse circuits V1 and V2 of the array 60 can be constructed very simply using power supplies, resistor dividers and an array of inexpensive low frequency switches one for each row and column. FIG. 13 shows a detail of a pulse circuit 80 with a connection to the switch array 81. The pulse circuit 80 includes a voltage source 82 set at +V₀, two identical resistors R1 84a, 84b with typical values of 2000 ohms each, a smaller resistor R2 86 with a typical value of 110 ohms, and two low frequency switches 86a–86b, one for turn-on and one for turn-off.

Consider the pulse circuit 80 in isolation. With both switches 88a, 88b open, the voltage imposed by the pulse circuit is V₀/2. When only the turn-on switch 88a is closed, the imposed voltage nearly doubles to V₀ since R2<<R1, and when only the turn-off switch 88b is closed, the imposed voltage drops to zero volts.

For application to the thyristor switch 60, let V₀=V_a for the horizontal pulse circuits H1, H2, and let V₀=−Va for the vertical pulse circuits V1, V2. In the case where Thyristor T12 is OFF and the switches 88a, 88b for H1 and V2 are open, the voltages imposed by H1 and V2 are Va/2 and −Va/2 respectively so that the voltage drop across thyristor T12 is Va, the operating voltage in the OFF state. In the case where Thyristor T12 is ON and the switches 88a, 88b for H1 and V2 are open, the voltages imposed by H1 and V2 are Vc/2 and −Vc/2 respectively so that the voltage drop across thyristor T12 is Vc, the operating voltage in the ON state. As discussed above with reference to FIG. 4, the voltage drop from Va to Vc results from the load resistance of the pulse circuits H1, V2 in the circuit that includes the thryristor T12 in the ON state.

Figure 5:
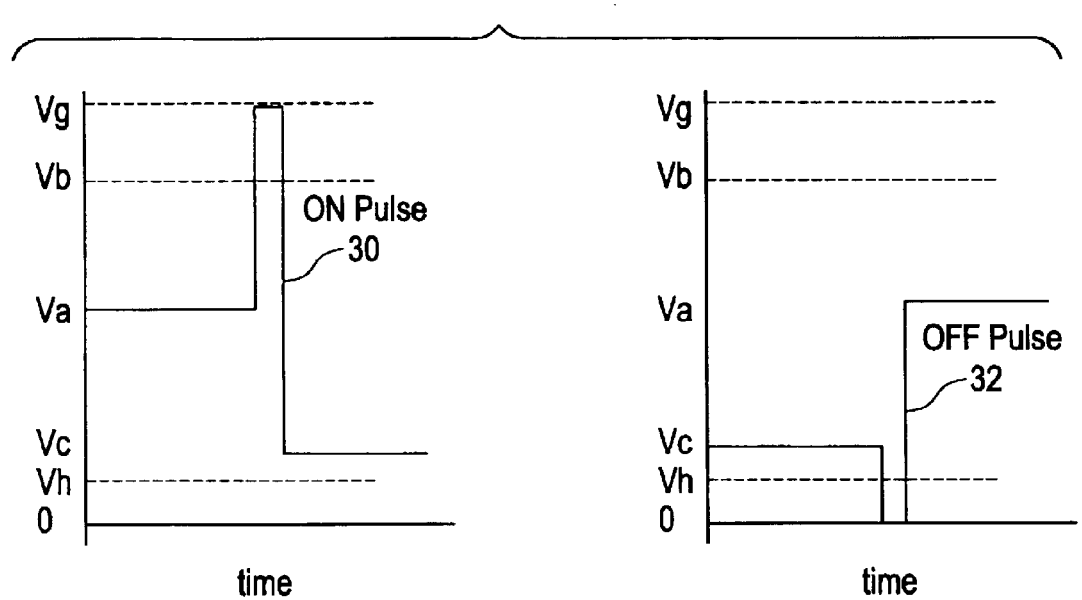
FIG. 5 shows pulse sequences related to the operation of a thyristor.
Figure 14:
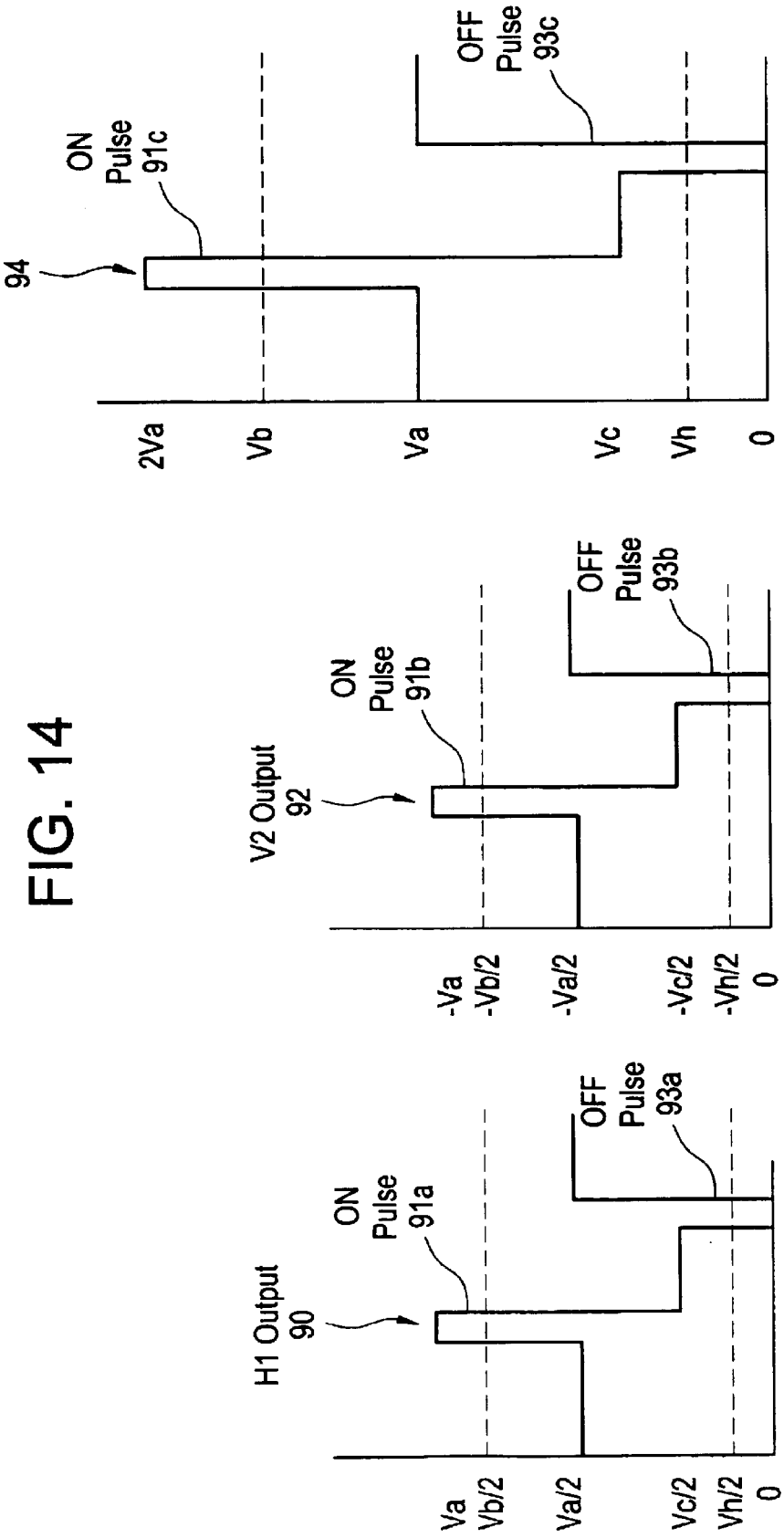
FIG. 14 shows output sequences illustrating the operation of the switch array shown in FIG. 10.

The operation of the thyristor array 60 is illustrated in FIG. 14 with reference to the thyristor hysteresis curve of FIG. 4. For the purposes of this example, the turn on pulse amplitude Vg is set as Vg=2Va. (cf. FIG. 5), and the operating voltages, Va and Vc, are chosen to satisfy the following conditions:

$$Vh<Vc \quad (8a)$$

$$3Va/2<Vb<2Va. \quad (8b)$$

FIG. 14 shows the H1 output 90, the V2 output 92 and the corresponding difference output across thyristor T12 94. There are two types of waveforms shown here (cf. FIGS. 4–5). The first is an ON pulse 91a–91c necessary to turn the thyristor from an OFF state to an ON state. The second is an OFF pulse 93a–93c necessary to turn the thyristor from an ON state to an OFF state. As illustrated by the H1 output 90 and the V2 output 92, the pulse circuits deliver a bias as well as a pulse.

Initially, all thyristors T11, T12, T21, T22 are in the OFF state. The H1 output 90 and the V2 output 92 show voltage levels of Va/2 and –Va/2 respectively, and the corresponding difference output across thyristor T12 94 is Va, the operating voltage in the OFF state. The ON pulse 91a–91c can be characterized by synchronized pulse functions of the form A*P(t), where P(t) is a normalized pulse and A is an amplitude. The ON pulse 91a–91c can be expressed as:

$$H1=Va/2+(Va/2)*P(t) \quad (9)$$

$$H2=Va/2 \quad (10)$$

$$V1=-Va/2 \quad (11)$$

$$V2=-Va/2-(Va/2)*P(t) \quad (12)$$

The outputs from H1 90 and V2 92 have opposite polarity. The outputs from H2 and V1 have no pulse applied and so they remain steady at Va/2, which corresponds to the operating voltage Va in the OFF state. As illustrated by the difference output across thyristor T12 94 in FIG. 14, the Turn-ON voltage waveforms across the thyristors T11, T12, T21 and T22 are given by U11, U12, U21 and U22 respectively:

$$U11=H1-V1=Va+(Va/2)*P(t) \; U11(peak)=3Va/2 \quad (13)$$

$$U12=H1-V2=Va+(Va)*P(t) \; U12(peak)=2Va \quad (14)$$

$$U21=H2-V1=Va \; U21(peak)=Va \quad (15)$$

$$U22=H2-V2=Va+(Va/2)*P(t) \; U22(peak)=3Va/2 \quad (16)$$

The ON pulse 91a–91c causes only thyristor T12 to switch. Thyristor T12 with amplitude U12 has a peak pulse amplitude of 2Va which is greater than Vb and therefore adequate to switch from the OFF state to the ON state. Thyristors T11 and T22 each have a peak pulse amplitude of 3Va/2, which is less than Vb and therefore inadequate to switch from the OFF state to the ON state. Finally, thyristor T21, which sees no effect of the ON pulse 91a–91c, remains in the OFF state.

After the ON pulse 91a–91c, thyristor T12 is in the ON state. The H1 output 90 and the V2 output 92 show voltage levels of Vc/2 and –Vc/2 respectively, and the corresponding difference output across thyristor T12 94 is Vc, the operating voltage in the ON state. The subsequent OFF pulse 93a–93c can be expressed as:

$$H1'=Vc/2-(Vc/2)*P(t) \quad (17)$$

$$H2'=Va/2 \quad (18)$$

$$V1'=-Va/2 \quad (19)$$

$$V2'=-Vc/2+(Vc/2)*P(t). \quad (20)$$

The Turn-OFF voltage waveforms across the thyristors T11, T12, T21 and T22 are given by U11', U12', U21' and U22' respectively:

$$U11'=H1'-V1'=Vc/2-(Vc/2)*P(t)+Va/2 \; U11'(min)=Va/2 \quad (21)$$

$$U12'=H1'-V2'=Vc-Vc*P(t) \; U12'(min)=0 \quad (22)$$

$$U21'=H2'-V1'=Va \; U21'(min)=Va \quad (23)$$

$$U22'=H2'-V2'=Va/2+Vc/2-(Vc/2)*P(t) \; U22'(min)=Va/2 \quad (24)$$

The OFF pulse 93a–93c causes only thyristor T12 to switch. Thyristor T12 with amplitude U12' has a minimum amplitude of 0 volts, which is less than Vh and therefore adequate to switch from the ON state to the OFF state. Thyristors T11, T21, and T22 all remain in the OFF state since only a pulse above Vb causes a transition from the OFF state to the ON state.

Qualitatively, the switching example shown in FIG. 14 does not change when thyristor T21 is in the ON state. Then equations (9)–(16), which describe the effect of the ON pulse 91a–91c, become:

$$H1=Va/2+(Va/2)*P(t) \quad (25)$$

$$H2=Vc/2 \quad (26)$$

$$V1=-Vc/2 \quad (27)$$

$$V2=-Va/2-(Va/2)*P(t) \quad (28)$$

$$U11=H1-V1=Va/2+(Va/2)*P(t)+Vc/2 \; U11(peak)=Va+Vc/2 \quad (29)$$

$$U12=H1-V2=Va+(Va)*P(t) \; U12(peak)=2Va \quad (30)$$

$$U21=H2-V1=Vc \; U21(peak)=Vc \quad (31)$$

$$U22=H2-V2=Va/2+(Va/2)*P(t)+Vc/2 \; U22(peak)=Va+Vc/2 \quad (32)$$

The ON pulse 91a–91c causes only thyristor T12 to switch. Since Vc<Va, T11 and T22 remain in the OFF state. T21 remains undisturbed in the ON state. Similarly, equations (17)–(24), which describe the effect of the OFF pulse 93a–93c, become:

$$H1'=Vc/2-(Vc/2)*P(t) \quad (33)$$

$$H2'=Vc/2 \quad (34)$$

$$V1'=-Vc/2 \quad (35)$$

$$V2'=-Vc/2+(Vc/2)*P(t). \quad (36)$$

$$U11'=H1'-V1'=Vc-(Vc/2)*P(t) \; U11'(min)=Vc/2 \quad (37)$$

$$U12'=H1'-V2'=Vc-Vc*P(t) \; U12'(min)=0 \quad (38)$$

$$U21'=H2'-V1'=Vc \; U21'(min)=Vc \quad (39)$$

$$U22'=H2'-V2'=Vc-(Vc/2)*P(t) \; U22'(min)=Vc/2 \quad (40)$$

The OFF pulse 93a–93c causes only thyristor T12 to switch. Thyristors T11 and T22 remain in the OFF state since only a pulse above Vb causes a transition from the OFF state to the ON state. T21 remains undisturbed in the ON state In the telecommunications application of the switch as a permutation switch, only one row is connected to one column and vice versa. Therefore it is impossible to have thyristors T11 and T12 on at the same time. The same holds for T21 and T22. Thus, the example presented above is representative for the general case of an N×N switch array.

The pulses shown in the example of FIG. 14 have sharp corners; however, in some operational settings relatively smooth (or rounded) pulses may be preferable in order to avoid spurious behavior resulting from related high-frequency components. Then, for example, replacing the switches 88*a*, 88*b* with potentiometers provides more control over the shape of pulses generated by the pulse circuit 80. Under nominal conditions for many telecommunications applications, the pulse duration time for switching can be as large as 1 millisecond, a time that is typically large compared to the reciprocal bitrate which for 10 GBps is 0.1 picosecond. The turn-on and turn-off times are coincident between the horizontal switch elements H1, H2 and vertical switch elements V1, V2.

By the use of thyristor addressing, the present invention advantageously eliminates the need for many control wires required by conventional designs for telecommunications switches. In general, a telecommunications analog N×N crosspoint switching array consists of N inputs, N outputs, $N^2$ switches and requires at least $N^2$ control lines which connect the switches to external voltage sources. For a large array with 1,000 switches, there are typically at least 1,000,000 control lines to be connected from the interior of the switch array to the exterior of the switch array, thereby requiring large scale integration (LSI) packaging techniques that challenge current capabilities.

By contrast, In the embodiment shown in FIG. 10, the control lines operating at low frequency share the same input and output lines of the switching array operating at high frequency, and so no new control lines need be added. A thyristor is located at each intersection of input and output lines. Because of the hysteresis property of the thyristor as illustrated in FIG. 4, it can operate in a HIGH conduction state and a LOW conduction state at the same applied voltage. In the HIGH conduction state, the microwave signal is switched from a horizontal input line 64*a*, 64*b* to a vertical output line 66*a*, 66*b* in the crosspoint switching array 60, while, in the LOW conduction state, the microwave signal is not switched. Similarly, for traffic in the opposite direction, the microwave signal is switched from a vertical output line 66*a*, 66*b* to a horizontal input line 64*a*, 64*b* in the HIGH conduction state and not switched in the LOW conduction state.

Thus, for example, an embodiment of the present invention can be scaled to achieve a telecommunications switching array to 1024×1024 at 40 GHz with advantages associated with simplicity of design and corresponding high yield. Since the thyristor array is an analog device with memory, the full functionality of switching is obtained here with no extra independent wires attached to the switching elements.

Figure 15:
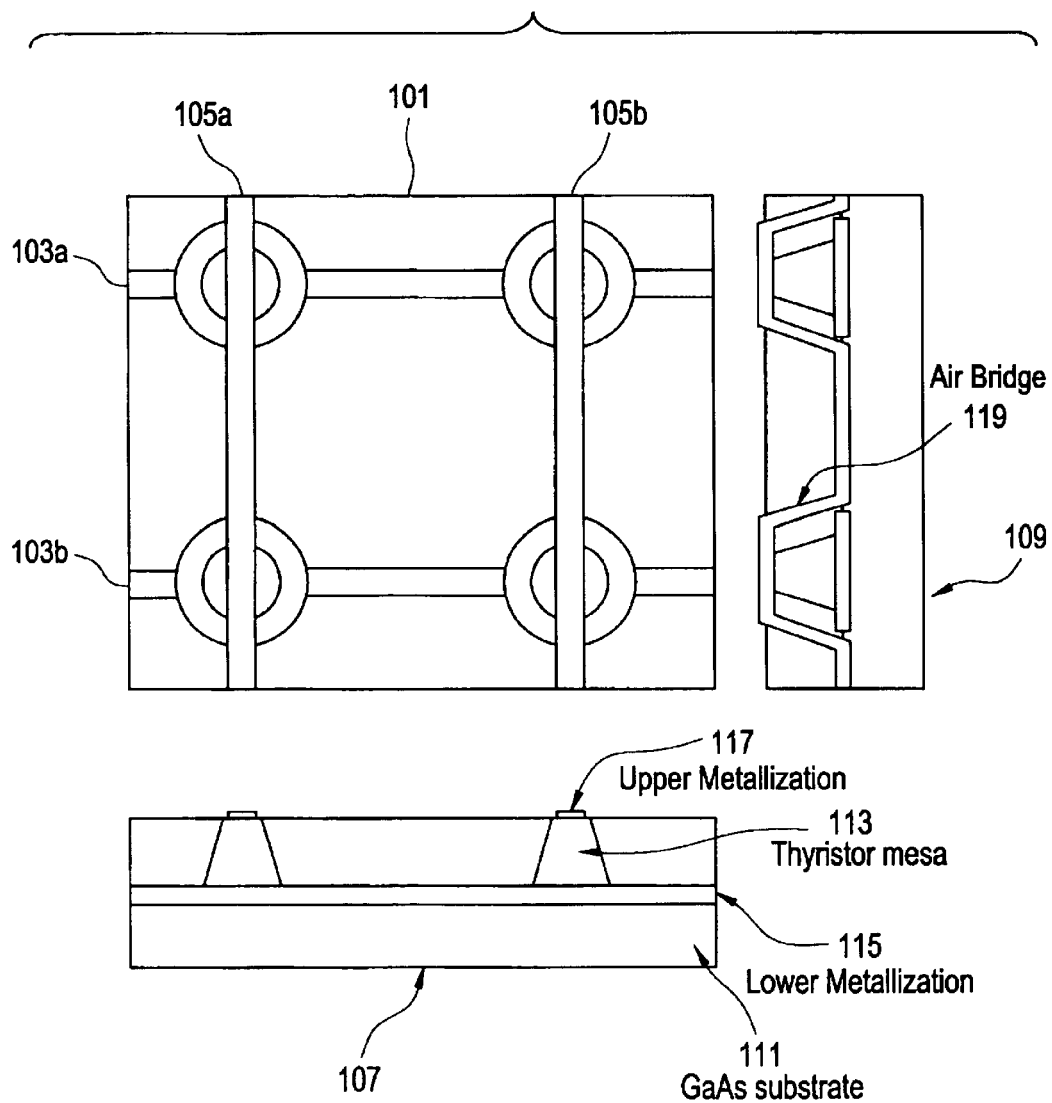
FIG. 15 shows a 2×2 switch array according to an embodiment of the present invention.
Figure 16:
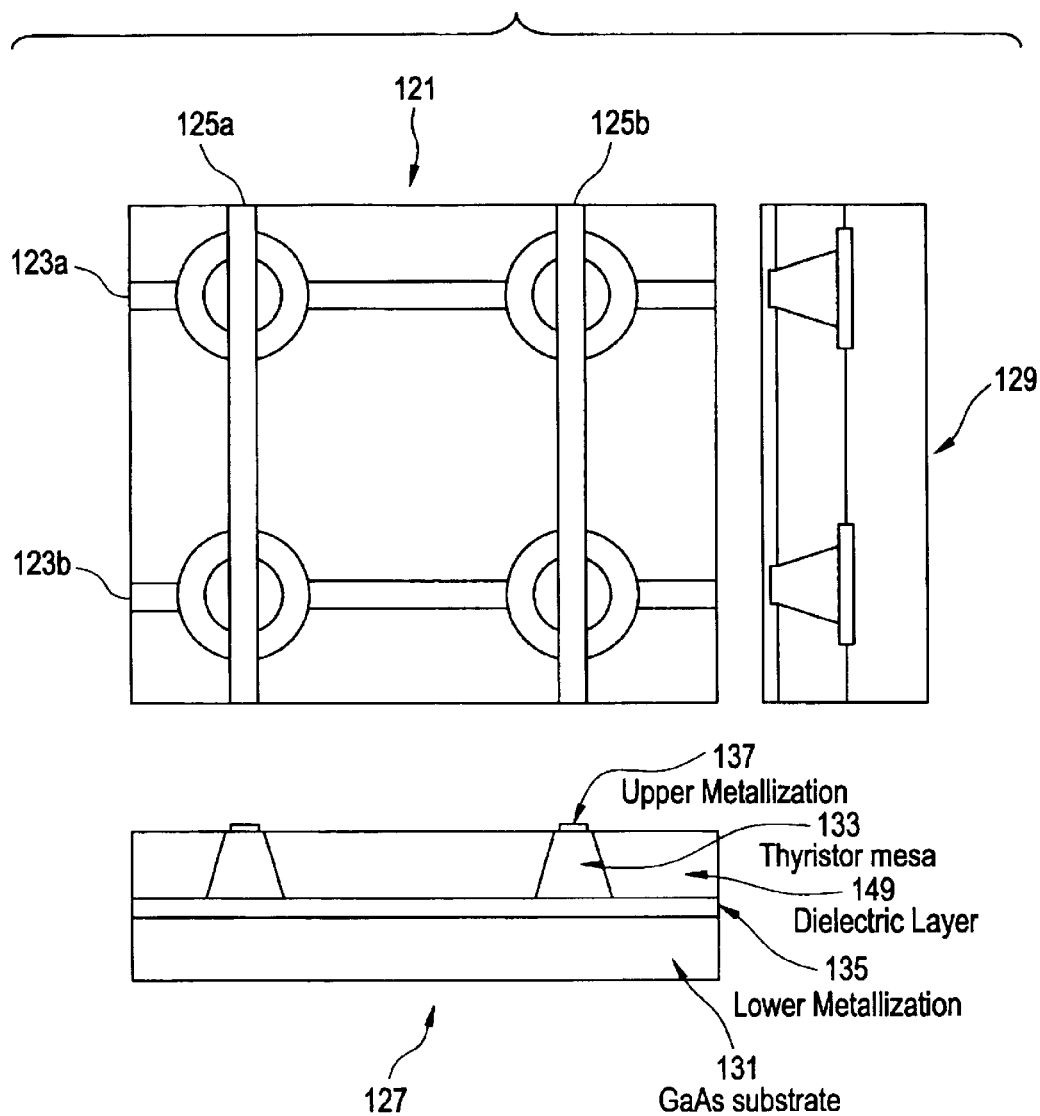
FIG. 16 shows a 2×2 switch array according to an embodiment of the present invention.
Figure 17:
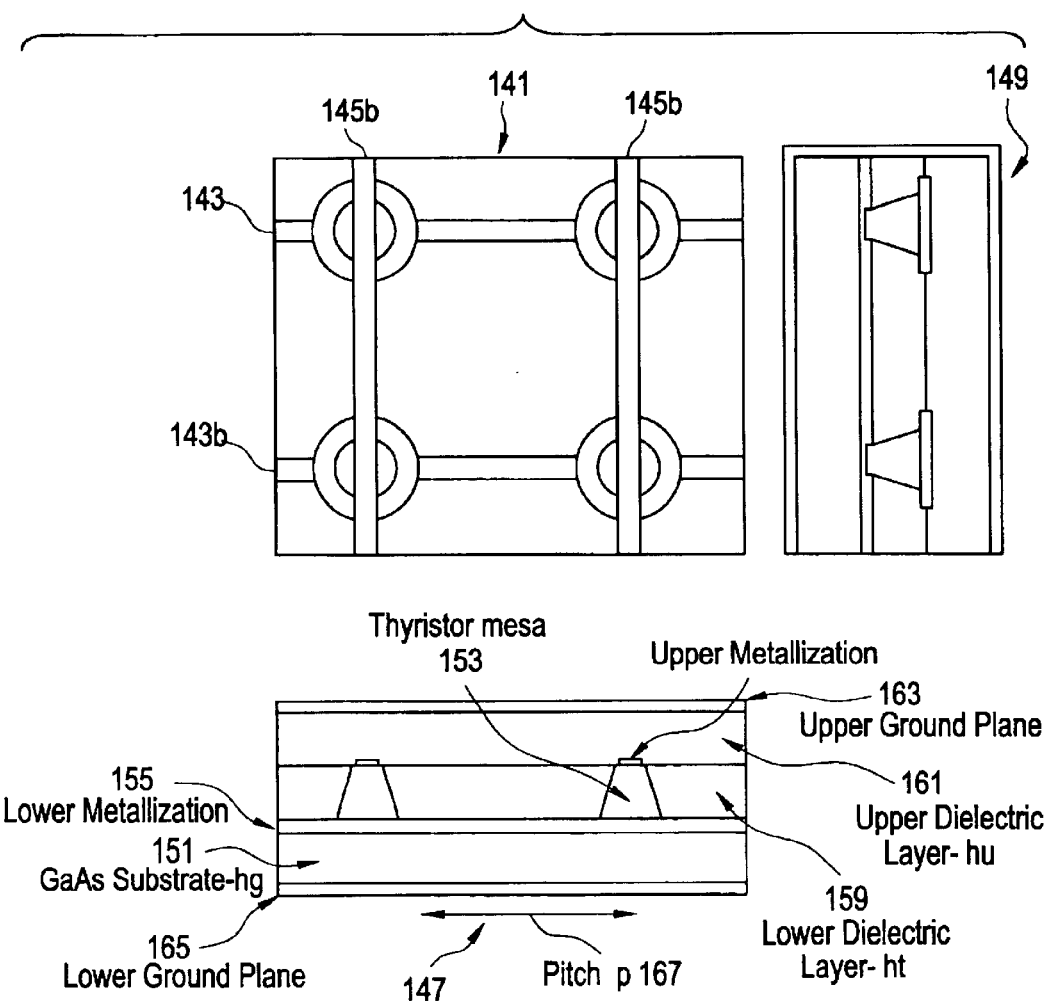
FIG. 17 shows a 2×2 switch array according to an embodiment of the present invention.
Figure 18A:
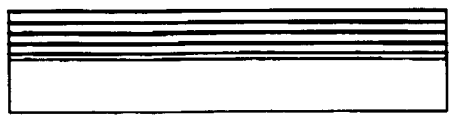
FIG. 18 shows a method for fabricating a switch array according to an embodiment of the present invention.
Figure 18B:
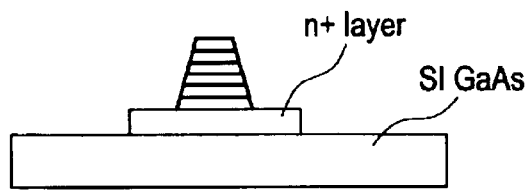
Figure 18C:
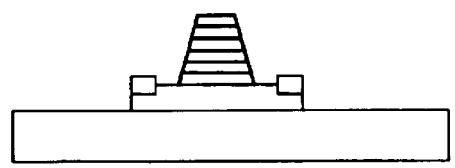
Figure 18D:
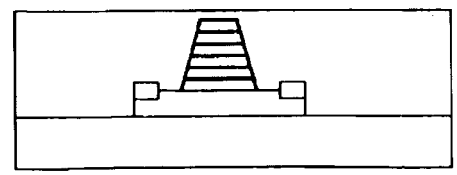
Figure 18E:
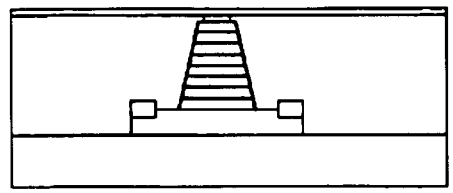
Figure 18F:
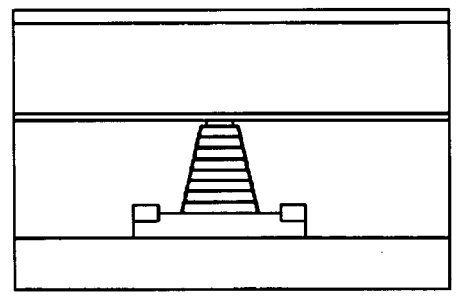
Figure 18G:
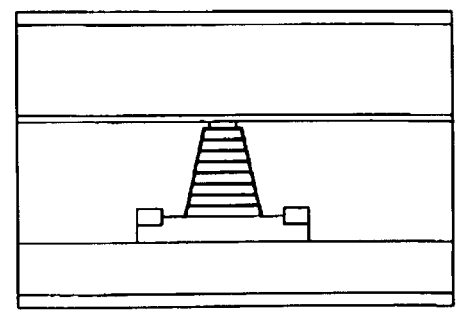

FIGS. 15–17 show specifically preferred embodiments of the present invention, which are consistent with the design shown in FIG. 10. These embodiments include features that relate to the lithography of metallization layers that connect thyristors in a switch array. The discussion of these embodiments does not include elements such as the capacitors 62*a*–62*h* shown in FIG. 10 since these elements are placed outside the GaAs (or Si) structure.

A first specifically preferred embodiment of the present invention is shown in the 2×2 switch of FIG. 15. In a top view 101, input lines 103*a*–103*b* are shown horizontally and output lines 105*a*–105*b* are shown vertically. A first elevation view 107 is shown from a cross-section taken along a horizontal input line 103*a*, and a second elevation view 109 is shown from a cross-section taken along a vertical output line 105*a*. Thyristor mesas 113 are disposed on a GaAs substrate 111, where each mesa has the six-layer structure of the thyristor 70 shown in FIG. 11. A lower metallization 115 forms the input lines 103*a*–103*b*. An upper metallization 117 forms the output lines 105*a*–105*b*, including a sinuous air bridge structure 119.

The air bridge design of FIG. 15 can be constructed from known principles as discussed above with reference to FIG. 11. First, an organic material is deposited on a mesa 113, following the contour of the mesa 113. Then a via is opened up to the anode upper layer of the mesa 113. Anode metallization follows next by dielectric application over the mesa 113 and development followed by depositing Ti/Pt/Au metallization on the GaAs substrate 111 in a striped pattern that rises up the mesa slope to make contact to the p+ anode at the top of the mesa. Finally, the dielectric is removed to leave the air bridge design 119. The air bridge 119 advantageously uses Ti/Pt/Au, which has a much higher mechanical strength than Au, for improved mechanical rigidity and reliability.

The embodiment shown in FIG. 15 advantageously combines a low-capacitance thyristor according to the present invention with an air bridge design for the interconnections. However, according to well-known principles of planar integrated circuits, it is generally preferable to execute photoresist, development and metallization on a planar surface rather than on a mesa surface. Additional embodiments are presented below where planar connections are made for the upper and lower metallization layers.

A second specifically preferred embodiment of the present invention is shown in the 2×2 switch of FIG. 16, where the upper metallization is supported as a planar layer. In a top view 121, input lines 123*a*–123*b* are shown horizontally and output lines 125*a*–125*b* are shown vertically. A first elevation view 127 is shown from a cross-section taken along a horizontal input line 123*a*, and a second elevation view 129 is shown from a cross-section taken along a vertical output line 105*a*. Thyristor mesas 133 are disposed on a GaAs substrate 131, where each mesa has the six-layer structure of the thyristor 70 shown in FIG. 11. A lower metallization 135 forms the input lines 123*a*–123*b*. An upper metallization 137 forms the output lines 125*a*–125*b*. This embodiment includes a dielectric layer 149 that structurally supports the upper metallization 137 as a planar layer. As shown in the second elevation view 129, the lower metallization 135 and the upper metallization 137 each lie on a plane. A good material for the dielectric layer 149 is polystyrene, which is known to have a loss tangent of 0.0003 at 10 GHz, a value that is acceptably low for many telecommunications applications. Additional alternative choices are presented below in Table 1.

By contrast the air bridge design of FIG. 15 places undesirable requirements on the design. Challenges associated with this air bridge lithography may be substantial since the Ti/Pt/Au metallization must follow a relatively narrow path up the slope of a mesa 113. Complications also arise because a large depth of field is needed for focussing optical light through a mask onto a photoresist layer at the sidewall of the mesa 113. Also the uniform deposition of a Ti/Pt/Au layer on such a sidewall is more difficult than on a planar surface. Because a less difficult process generally results in a higher process yield, the embodiment shown in FIG. 16, which includes a planar metallization design, should lead to higher yields as compared with the embodiment shown in FIG. 15. For example, in a 1,000×1,000 switch with 1,000,000 thyristors, a desirable benchmark for the yield is 0.999999, a stringent requirement that underscores the desirability of a simple and reliable process for the metallization.

A third specifically preferred embodiment of the present invention is shown in the 2×2 switch of FIG. 17, where ground planes are added above and below the structure shown in FIG. 16 in order to minimize crosstalk. In a top view 141, input lines 143*a*–143*b* are shown horizontally and output lines 145*a*–145*b* are shown vertically. A first elevation view 147 is shown from a cross-section taken along a horizontal input line 143a, and a second elevation view 149 is shown from a cross-section taken along a vertical output line 105a. Thyristor mesas 153 are disposed on a GaAs substrate 151, where each mesa has the six-layer structure of the thyristor 70 shown in FIG. 11. A lower metallization 155 forms the input lines 143a–143b. An upper metallization 157 forms the output lines 145a–145b. This embodiment includes two dielectric layers for support, a lower dielectric layer 159 and an upper dielectric layer 161. The lower layer 159 structurally supports the upper metallization 157 as a planar layer. The upper layer 161 supports an upper ground plane 163. A lower ground plane 165 lies at the opposite end, below the GaAs substrate 151.

The thicknesses of the upper dielectric layer 161, lower dielectric layer 159, and GaAs layer 151 are hu, ht and hg, respectively and the pitch 167 is p. As is well-known to those skilled in the art, crosstalk between adjacent lines is reduced by positioning the ground planes as close as possible to the row 143a–143b and column 145a–145b electrodes. This is accomplished at a constant pitch p by reducing the dielectric heights hu and ht, and by reducing the GaAs substrate thickness hg. The reduction of hg can be accomplished by etching the GaAs from the backside after frontside processing, as will be described below with reference to FIG. 18.

The embodiments shown in FIGS. 16 and 17 resemble printed circuit boards in the sense that there are two metallization levels and possibly one or more ground planes. Yet the design is made on a single chip. For this reason, such a design may be called a "board on chip" design.

A preferred embodiment for a fabrication method applicable to the embodiments shown in FIG. 17 is illustrated in FIG. 18, where method steps are shown with reference to a cross section of a single thyristor.

Step A includes growing a wafer of GaAs with multiple layers having appropriate doping. For example, the embodiment shown in FIG. 11 has a multi-layer structure of the form $p^+$-i-n-i-p-$n^+$.

Step B includes the etching process that forms the thyristor mesas. The etching process is in two steps. First, lithography is used with photoresist to etch the GaAs stack down to the n+ layer at the base of the stack. This n+ layer forms an extended base of the mesa Next, subsequent lithography is used with photoresist to etch the n+ layer away from the mesa down to the SI GaAs substrate underneath.

Step C includes the addition of metallization atop the n+ layer at the base of the stack. The metallization is done in two steps. First photoresist is applied and a trench via is opened in the mask using photolithography. The trench via is located at the outer region of the n+ layer and can be in the shape of a semicircle as shown in FIG. 17 (i.e., lower metallization 155). Metallization is applied through the trench via using evaporation or sputtering and then driven in using a thermal anneal operation in order to form a good ohmic contact with the underlying n+ GaAs material. Then the metal atop the ohmic contact is plated up, typically with gold, in order to thicken the metallization layer. Apart from the mesa, the metallization follows a straight-line row of width w and near the mesa, it divides into two semicircular arcs of width w/2, in order to minimize the overall line resistance.

Step D includes the deposition and leveling of an organic material, which serves the role of a spacer material for the upper metallization layer to follow. A typical example of this is polystyrene, which has a low loss tangent at 10 GHz of 0.0003. The organic material is deposited by a spin-on process and then dried. After heating to a desired temperature, the material becomes very fluid with low viscosity. The surface tension then acts to level the fluid in order to reduce surface energy. The leveled fluid is then cooled to form the leveled solid. The desirable mesa thickness for this effect to occur is a few microns greater than the mesa height.

Step E includes depositing photoresist, using photolithography to open up a contact area atop each thyristor and depositing metal on this contact. The metal is driven in under a thermal anneal to make a good ohmic contact. Then it is plated up using gold for improved conductivity. Apart from the thyristor the metal forms a column as shown in FIG. 17.

Step F includes adding a second layer of polymer by a spin-on process. Since there is minimal height variation of the underlying structure, a planarization step involving thermal annealing is probably not necessary. After the polymer is deposited and dried, a metalization step with gold plating is performed. Since there is no pattern, there is no necessity for using photoresist. This metalization provides a top layer ground plane, which is important for the purposes of signal isolation between adjacent lines.

Step G includes turning the GaAs wafer upside down and depositing metal with gold plating on the back side of the wafer for the purposes of having a bottom layer ground plane, which further reduces signal isolation between adjacent lines. In addition, it is possible to consider thinning the wafer at this step prior to metal deposition. Thinning can take place by coating the front surface with wax, and then mechanically etching uniformly at a constant rate for a fixed time, or by etching up to an etch stop which is built into the dopant stack of the GaAs. Such an etch stop could be a layer of AlGaAs which is not attacked by the same etchant as GaAs.

FIG. 18 shows a preferred method for fabricating a switch array as shown in FIG. 17. Additionally, this method is applicable to the embodiment shown in FIG. 16 without ground planes by elimination of Steps F and G. Several organic spacer materials can be used in Step D, as illustrated by the entries in Table 1 which include relative dielectric constants and loss tangents measured at 10 GHz. For example, a preferred choice among thermoplastic materials is polystyrene, whose dielectric properties are comparable to alumina. Alternatively, a preferred choice among thermosetting materials is benzocyclobutene.

TABLE 1

Candidates for Organic Spacer Materials

| MATERIAL | $\epsilon_r$ | Tan δ (25° C.) |
|---|---|---|
| Polyethylene | 2.25 | 0.0004 |
| Polystyrene | 2.54 | 0.00033 |
| Teflon | 2.08 | 0.0004 |
| Benzocyclobutene | 2.62 | 0.0060 |

In operation of the switch array 60 as illustrated by FIG. 14, considerable signal distortion may result from the analog nature of the device. For example, when a thyristor array operating at 10 GHz is used with a OC-192 telecommunications protocol which operates at 10 GBps, each of the square digital pulses in OC-192 will be distorted considerably in passing through the thyristor analog array. These distortions may be further compounded by timing errors that result from differences in path lengths across the switch.

The input correction unit 47 and the output correction unit 49 each include correction circuits to counterbalance the distortion of signals passing through the array. Typically, for an N×N array 48 that includes $N^2$ thyristors, each correction unit 47, 49 includes N correction circuits (or N composite circuits). In the preferred embodiment, the input correction unit 47 and the output correction unit 49 each include N reshaping circuits. The output correction unit 49 also includes N forward-error correction circuits and N retiming circuits and may further include N leveling circuits. Other combinations of these circuits are also possible.

Figure 19:
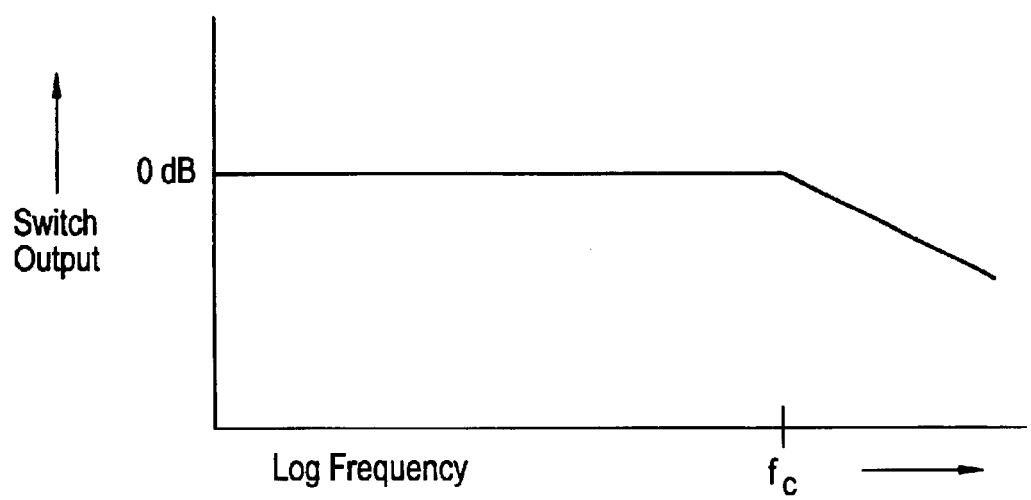
FIG. 19 is a schematic diagram of the output of an ideal linear analog broadband passthrough switch which is flat for all frequencies from DC up to a cutoff frequency $f_c$.

The importance of error correction circuitry in the correction units 47, 49 is illustrated with reference to FIG. 19. An ideal wideband switch is an analog device that transmits all frequencies from DC (direct current) to a cutoff frequency $f_c$, without distortion. In other words, this is a flat frequency response up to a cutoff, as shown in FIG. 19. In S-parameter terminology appropriate to analog circuits, the switch output for a single switch is denoted as $S_{21}$, which is the transmission coefficient for insertion loss in the case when the switch is open and the transmission coefficient for isolation loss in the case when the switch is closed.

At frequencies greater than 10 GHz, it becomes increasingly difficult and expensive to obtain ideal linear switch performance as shown in FIG. 19. Ideal (or nearly ideal) linear performance must be achieved in the presence of system constraints including minimal static power consumption (i.e., power consumption in the quiescent non-switching state), minimal crosstalk, and minimal insertion loss. Linearity in the presence of these system constraints complicates the design and manufacture of an ideal stand-alone high frequency wideband passthrough switch, especially when high bitrates are required.

Interconnecting transmission line waveguides that are needed to connect the above described switches in an array also generate a decreased response at higher frequency. This is due in large part to the "skin effect" which causes an increased resistance in each transmission line at higher frequencies and also to an increased inductance resulting from the presence of vias and other non-planar elements. Other distortions in the transmissions result from cross-couplings between adjacent parallel transmission lines and cross-couplings between transmission lines and connected thyristors.

Figure 20:
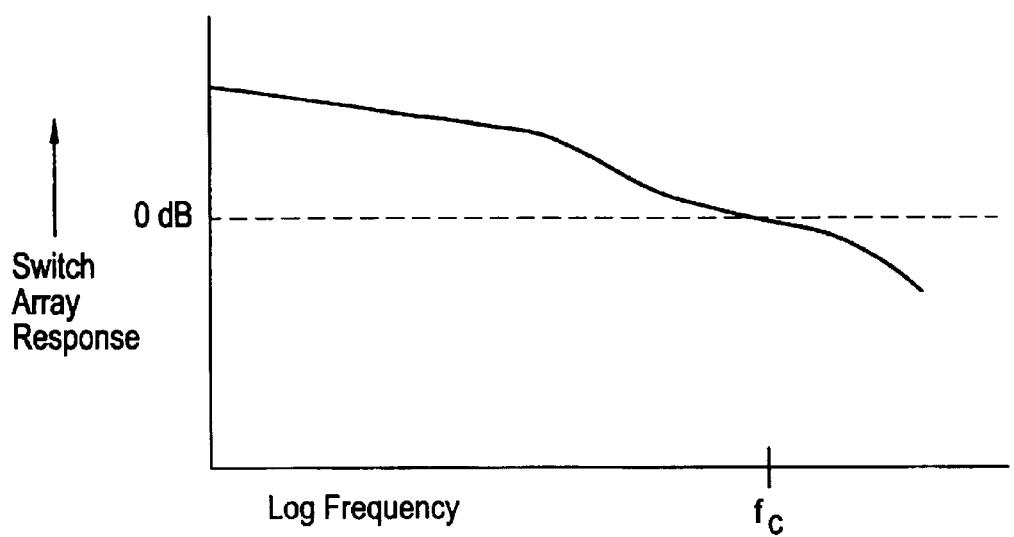
FIG. 20 is a schematic diagram of the output of a non-ideal passthrough switch array whose output generally falls with frequency.

The combined output of the switch response and the interconnect response is called a "switch array response" and is shown schematically in FIG. 20 where the cutoff frequency $f_c$ is again shown. This non-ideal response differs considerably from the ideal response shown in FIG. 19 and has the effect of rounding off the corners of digital signals, which creates bit error rates that will be unacceptable, if left uncorrected. Qualitatively, bit error rate is sensitive to both frequency dependence of array response and to signal attenuation.

The present invention counteracts these effects across the switch array 48 by combinations of error correction circuitry at the input correction unit 47 and the output correction unit 49. Reshaping circuits and retiming circuits are used to reduce signal attenuation. Feedforward error correction circuits are used to reduce the bit error rate, and leveling circuits are used to decrease frequency dependence at the expense of increased signal attenuation. As a result, the distorted signal illustrated by the switch array response of FIG. 20 is corrected to more closely follow the ideal response shown in FIG. 19.

There are many kinds of error correction circuits that may be included to further reduce the bit error rate. Some have feedback components and some have feedforward components. As discussed above, the preferred embodiment includes feedforward error correction (FEC) circuitry.

Typically, feedforward error correction systematically adds redundancy to a serial bit stream in order to correct bit errors. For example, in some telecommunications applications feedforward error correction requires an additional 16 bytes for every 256 bytes in the bitstream (i.e., ~6% redundancy). Although this redundancy necessarily reduces bandwidth, the gain from error reduction is often substantial (e.g., orders of magnitude). ("Reference Manual for Telecommunications Engineering", second edition, Wiley Publications, NY (1994), Chapter 16)

The present invention advantageously combines a relatively large number of inexpensive non-ideal switch components, whose response generally falls with frequency. These components are assembled into a switch array 48 that includes inexpensive non-ideal interconnect structures consisting of transmission lines, vias, etc., whose response generally falls with frequency. A relatively small number of error-correcting circuits are included as pre-processing and post-processing for the array 48 including reshaping and retiming circuits, leveling circuits and feedforward error correction circuits.

The leveling circuits, whose frequency response generally increases with frequency, introduce signal attenuation of the output signal at lower frequencies. The reshaping and retiming circuits substantially increase the system amplitude up to 20 Db and substantially negate the above-cited problems associated with signal attenuation. The feedforward error correction circuits also correct for errors. The net effect is a system built from an inexpensive set of components that meet the requirements of linearity and low bit error rate.

The number of switches included in the N-dimensional switch array 48 is of order $N^2$. However, the number of digital error correction circuits in the input correction unit 47 and the output correction unit 49 is of order N. Thus, the ratio of error correction circuits to switches is of order 1/N, and so for large N (e.g., N=100), the cost of the error correction circuitry is minimal. Additionally it is possible to combine error correction circuits into equivalent circuits. For example, the post-processing circuitry for leveling, reshaping and retiming, and feedforward error correction may be combined into a single array of digital circuits. Additionally, the error correction circuits of the input correction unit 47 and the output correction unit 49 may be absorbed into the microwave switch array 48 or alternatively into the converters 46, 50.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for making a thyristor for switching microwave signals, comprising the steps of:

growing a plurality of semiconductor layers on an upper surface of a substrate, the semiconductor layers including at least one semi-insulating layer; and etching a thyristor in the semiconductor layers, the thyristor being configured as a mesa having an upper conducting surface and a lower conducting surface, wherein the thyristor transmits a microwave signal between the upper conducting surface and the lower conducting surface in an ON state and blocks the microwave signal between the upper conducting surface and the lower conducting surface in an OFF state.

2. A method as claimed in claim 1, wherein the semiconductor layers include GaAs, and said at least one semi-insulating layer includes semi-insulating GaAs.

3. A method as claimed in claim 1, wherein the semiconductor layers include Si, and said at least one semi-insulating layer includes intrinsic Si.

4. A method as claimed in claim 1, wherein the frequency of the microwave signal is at least 1 GHz.

5. A method as claimed in claim 1, further comprising the steps of:
   connecting a first metallic contact to the upper conducting surface;
   connecting a second metallic contact to the lower conducting surface;
   connecting a first end of a metallic air bridge to the first metallic contact; and
   connecting a second end of the metallic air bridge to a third metallic contact.

6. A method as claimed in claim 1, wherein said at least one semi-insulating layer comprises a first semi-insulating layer and a second semi-insulating layer.

7. A method as claimed in claim 1, wherein the semiconductor layers include GaAs, said at least one semi-insulating layer includes semi-insulating GaAs, an upper semiconductor layer includes AlGaAs, and a lower semiconductor layer includes AlGaAs.

8. A method as claimed in claim 1, wherein the thyristor includes six semiconductor layers in a doping profile given by $p^+$-i-n-i-p-$n^+$.

9. A method as claimed in claim 1, wherein the thyristor includes six semiconductor layers in a doping profile given by $n^+$-i-p-i-n-$p^+$.

* * * * *